(12) United States Patent
Furukawa

(10) Patent No.: US 11,404,527 B2
(45) Date of Patent: Aug. 2, 2022

(54) METHOD FOR MANUFACTURING DISPLAY DEVICE AND DISPLAY DEVICE

(71) Applicant: SHARP KABUSHIKI KAISHA, Sakai (JP)

(72) Inventor: Tomoo Furukawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 141 days.

(21) Appl. No.: 17/047,905

(22) PCT Filed: Apr. 27, 2018

(86) PCT No.: PCT/JP2018/017319
§ 371 (c)(1),
(2) Date: Oct. 15, 2020

(87) PCT Pub. No.: WO2019/207798
PCT Pub. Date: Oct. 31, 2019

(65) Prior Publication Data
US 2021/0175316 A1 Jun. 10, 2021

(51) Int. Cl.
*H01L 27/32* (2006.01)
*G09G 3/3233* (2016.01)

(52) U.S. Cl.
CPC ....... *H01L 27/3276* (2013.01); *G09G 3/3233* (2013.01); *H01L 27/3262* (2013.01); *H01L 27/3265* (2013.01); *G09G 2300/0426* (2013.01); *G09G 2300/0819* (2013.01); *G09G 2300/0842* (2013.01); *G09G 2300/0861* (2013.01); *G09G 2320/045* (2013.01); *G09G 2330/10* (2013.01); *H01L 2227/323* (2013.01)

(58) Field of Classification Search
CPC .......... G09F 9/00; G09F 9/30; G09G 3/3233; G09G 2300/0426; G09G 2300/0819; G09G 2300/0842; G09G 2300/0861; G09G 2310/0251; G09G 2320/045; G09G 2330/10; G09G 2310/0262; H01L 27/3262; H01L 27/3265; H01L 27/3276; H01L 51/50; H01L 2227/323; H05B 33/02
See application file for complete search history.

(56) References Cited

U.S. PATENT DOCUMENTS

2009/0102758 A1 4/2009 Anzai et al.
2017/0193921 A1\* 7/2017 Sung ................... G09G 3/3258

FOREIGN PATENT DOCUMENTS

JP 2009-134246 A 6/2009

\* cited by examiner

*Primary Examiner* — Stacy Khoo
(74) *Attorney, Agent, or Firm* — ScienBiziP, P.C.

(57) ABSTRACT

Provided is a method for manufacturing a display device that allows easy and reliable repair of a pixel circuit by converting the pixel circuit into a black dot, and a display device. A repair wiring line configured to supply an off potential for turning a drive transistor to an off state is formed superimposed onto an impurity region of a semiconductor layer, interposed between a first compensation transistor and a second compensation transistor having a dual gate structure. The impurity region is irradiated with laser light, thereby connecting the impurity region and the repair wiring line. Then, the second compensation transistor is turned to an on state, thereby setting a potential of a node to the same potential as the off potential and turning the drive transistor to a normally-off state. As a result, a pixel circuit is converted into a black dot and thus repaired.

15 Claims, 23 Drawing Sheets

METHOD FOR MANUFACTURING DISPLAY DEVICE AND DISPLAY DEVICE

TECHNICAL FIELD

The present disclosure relates to a method for manufacturing a display device and a display device, and more specifically relates to a method for manufacturing a display device including an electro-optical element driven by current, such as an organic EL display device, and a display device.

BACKGROUND ART

In recent years, organic electroluminescent (EL) display devices have attracted attention as a display device having features such as thinness, high image quality, and low power consumption, and such display devices have been proactively developed. A display panel configured to display an image on the organic EL display device includes a display portion in which a plurality of pixel circuits are disposed, and a frame disposed surrounding the display portion and including a drive circuit configured to drive each of the pixel circuits disposed therein.

Each of the pixel circuits includes a plurality of transistors. When all of these transistors operate normally, each pixel circuit emits light at a brightness corresponding to a data signal. However, one of the transistors may transform to a normally-on state or a normally-off state, and thus no longer operate normally. A pixel circuit including a transistor that no longer operates normally is, for example, always turned off and thus a black dot, or always lit and thus a bright dot. Further, a gray scale abnormality may occur in a plurality of successive pixel circuits, causing a line defect to appear in the display portion.

A display panel in which a pixel circuit having such a defect is turned to a normally-off state when repaired and thus converted into a black dot is often unproblematic in terms of practical use as long as the number of defects is small. In this case, as long as the pixel circuit having the defect is repaired, production yield of the display panel can be improved and manufacturing costs can be reduced.

In PTL 1, each pixel circuit is divided into a plurality of regions, and one organic EL element is provided in each region. When a pixel circuit having such a configuration no longer lights normally, the pixel circuit is inspected to see whether the organic EL elements in the pixel circuit sequentially turn to the on state and light up. If there is an organic EL element that does not light up during the inspection, PTL 1 discloses repair in which a wiring line connected to the organic EL element is irradiated with laser light and fused, thereby disconnecting the organic EL element from the pixel circuit.

CITATION LIST

Patent Literature

PTL 1: JP 2009-134246 A

SUMMARY

Technical Problem

However, it is difficult to reliably fuse only the organic EL element that does not emit light such that the organic EL elements that normally emit light are not affected when each of the pixel circuits is divided into a plurality of regions and an organic EL element is provided in each region obtained by such division. Further, when a metal wiring layer is fused by laser light, laser light having a large output needs to be irradiated. Thus, a portion of the wiring line layer fused at this time may adhere to other locations, causing a short circuit.

Therefore, an object is to provide a method for manufacturing a display device that allows easy and reliable repair of a pixel circuit by converting the pixel circuit into a black dot, and a display device.

Solution to Problem

A method for manufacturing a display device according to a first aspect is a method for manufacturing a display device configured to display an image by supplying a data signal to each of a plurality of pixel circuits disposed in a display panel, the display device including a plurality of data lines supplied with the data signal, a plurality of scanning lines sequentially supplied with a scanning signal used for selecting a pixel circuit of the plurality of pixel circuits, the plurality of pixel circuits provided correspondingly to each intersection between the plurality of data lines and the plurality of scanning lines, and a scanning line drive circuit configured to sequentially select each of the plurality of scanning lines. Each of the plurality of pixel circuits includes an electro-optical element, a holding capacitor configured to hold a voltage that controls a drive current of the electro-optical element, a drive transistor configured to supply a drive current according to the voltage held by the holding capacitor to the electro-optical element, a compensation transistor configured to write the data signal applied from a data line of the plurality of data lines to a node connecting a control terminal of the drive transistor and the holding capacitor, and compensate a threshold voltage of the drive transistor, a first power source wiring line configured to supply a power supply potential necessary for supplying a drive current to the electro-optical element and causing the electro-optical element to emit light, and an off-potential supply wiring line configured to supply the power supply potential applied from the first power source wiring line as an off potential for turning the drive transistor to an off state. The compensation transistor is a transistor having a dual control terminal structure composed of a first compensation transistor and a second compensation transistor and formed in a semiconductor layer connecting the node and a second conduction terminal of the drive transistor. A second conduction terminal of the first compensation transistor and a first conduction terminal of the second compensation transistor are connected to an impurity region including impurities and formed in the semiconductor layer, interposed between the first compensation transistor and the second compensation transistor, a first conduction terminal of the first compensation transistor is further connected to a second conduction terminal of the drive transistor, a second conduction terminal of the second compensation transistor is connected to the node, and the first compensation transistor and a control terminal of the first compensation transistor are both connected to a scanning line of the plurality of scanning lines. A portion of the off-potential supply wiring line is formed superimposed onto the impurity region of the semiconductor layer with an inorganic insulating film interposed therebetween, and another portion of the off-potential supply wiring line is connected to a power source wiring line configured to apply the off potential. The method includes a step of irradiating a region where the off-potential supply wiring line and the impurity region are formed superimposed with laser light from a rear face side of the display panel, thereby evaporating the inorganic insulating film, and melting and thus directly connecting the off-potential supply wiring line and the impurity region.

Advantageous Effects of Disclosure

According to the first aspect, an off-potential supply wiring line configured to supply an off potential for turning the drive transistor to an off state is formed superimposed onto the impurity region of the semiconductor layer, which is interposed between the first compensation transistor and the second compensation transistor having the dual control terminal structure. Then, the inorganic insulating film interposed therebetween is irradiated with laser tight to evaporate the inorganic insulating film and fuse and connect the impurity region and the off-potential supply wiring line. Furthermore, the second compensation transistor is turned to an on state, thereby setting the potential of the node to the same potential as the off potential. Thus, the off potential is applied to the control terminal of the drive transistor, turning the drive transistor to a normally-off state. As a result, the drive current is no longer supplied to the electro-optical element and thus the electro-optical element turns to a normally-off state and converting the pixel circuit into a black dot.

BRIEF DESCRIPTION OF DRAWINGS

FIG. 12(a) is a plan view of a portion of the wiring line layout, FIG. 12(b) is a cross-sectional view along the arrow of the wiring line layout before repair, and FIG. 12(c) is a cross-sectional view along the arrow of the wiring line layout after repair. The drawings illustrate a portion of a display panel of a modification example of the first embodiment.

FIG. 13(a) is a plan view of a portion of the wiring line layout, FIG. 13(b) is a cross-sectional view along the arrow of the wiring line layout before repair, and FIG. 13(c) is a cross-sectional view along the arrow of the wiring line layout after repair.

FIG. 14(a) is a plan view of a portion of the wiring line layout, FIG. 14(b) is a cross-sectional view along the arrow of the wiring line layout before repair, and FIG. 14(c) is a cross-sectional view along the arrow of the wiring line layout after repair.

FIG. 15(a) is a plan view of a portion of the wiring line layout, FIG. 15(b) is a cross-sectional view along the arrow of the wiring line layout before repair, and FIG. 15(c) is a cross-sectional view along the arrow of the wiring line layout after repair.

FIG. 16(a) is a plan view of a portion of the wiring line layout, FIG. 16(b) is a cross-sectional view along the arrow of the wiring line layout before repair, and FIG. 16(c) is a cross-sectional view along the arrow of the wiring line layout after repair.

FIG. 17(a) is a plan view of a portion of the wiring line layout, FIG. 17(b) is a cross-sectional view along the arrow of the wiring line layout before repair, and FIG. 17(c) is a cross-sectional view along the arrow of the wiring line layout after repair.

DESCRIPTION OF EMBODIMENTS

A first embodiment and a second embodiment will be described below with reference to the accompanying drawings. Note that "connection" in the present specification means "electrical connection" unless otherwise specified and, without departing from the subject matter of the disclosure, includes not only a case meaning direct connection, but also a case meaning indirect connection by way of other elements.

1. First Embodiment

1.1 Configuration of Organic EL Display Device

Figure 1:
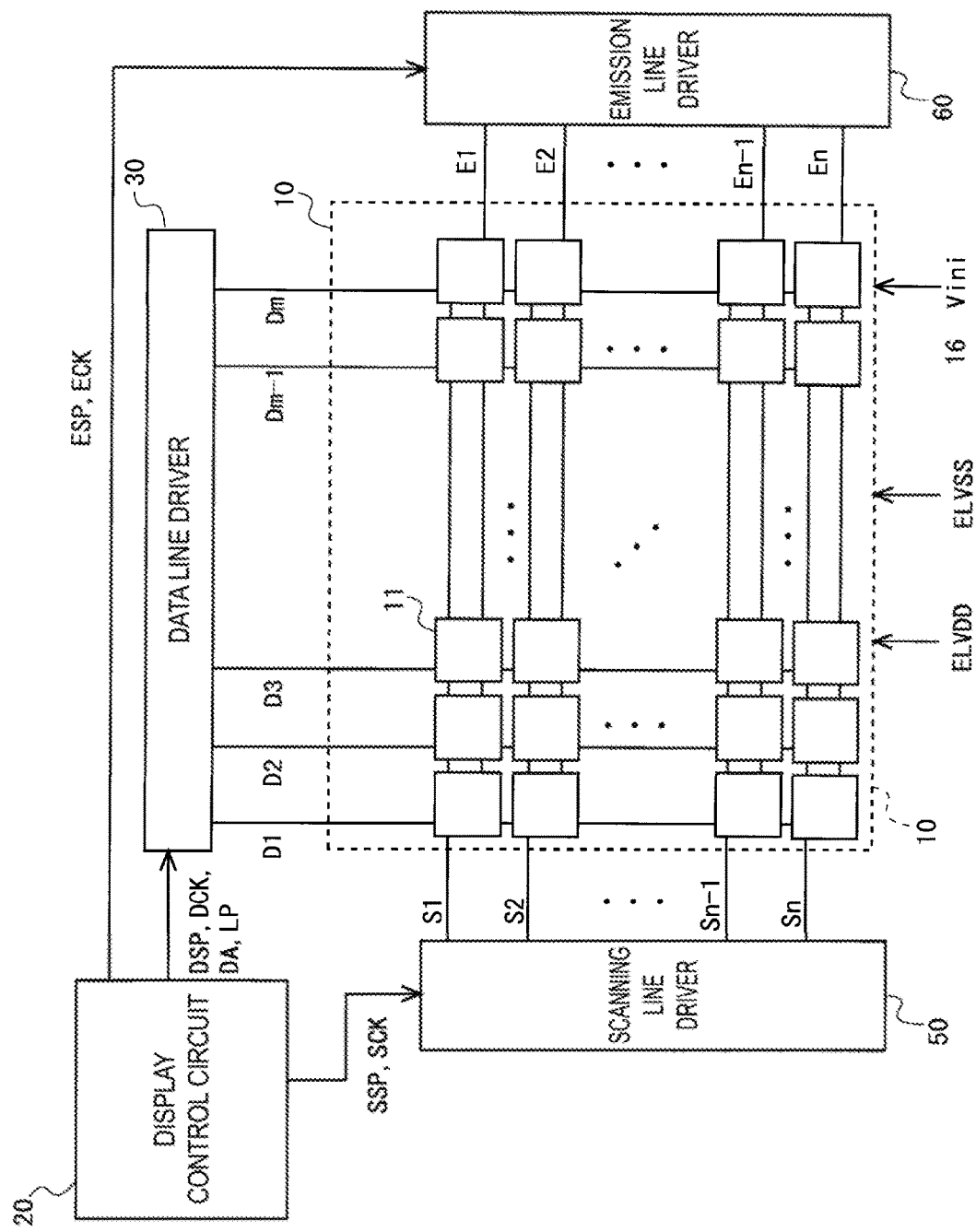
FIG. 1 is a block diagram illustrating an overall configuration of an organic EL display device according to a first embodiment.

FIG. 1 is a block diagram illustrating an overall configuration of an organic EL display device according to the first embodiment. As illustrated in FIG. 1, the organic EL display device (hereinafter simply referred to as "display device") includes a display portion 10, a display control circuit 20, a data line driver 30, a scanning line driver 50, and an emission line driver 60. The organic EL display device illustrated in FIG. 1 directly supplies a data signal to each data line from the data line driver 30. In the present embodiment, a data line drive circuit is realized by the data line driver 30, a scanning line drive circuit is realized by the scanning line driver 50, and a light emission control line drive circuit is realized by the emission line driver 60.

The display portion 10 includes m data lines D1 to Dm (where m is an integer greater than or equal to 2) and n scanning lines S1 to Sn (where n is an integer greater than or equal to 2). The display portion 10 is also provided with a pixel circuit 11 disposed at every intersection between each data line and each scanning line. More specifically, the display portion 10 is provided with m×n pixel circuits 11 respectively corresponding to intersections between the data lines D1 to Dm and the scanning lines S1 to Sn, respectively.

The display portion 10 is further disposed with emission lines E1 to En as n light emission control lines, in parallel with the n scanning lines S1 to Sn. The m data lines D1 to Dm are connected to the data line driver 30. The n scanning lines S1 to Sn are connected to the scanning line driver 50. The n emission lines E1 to En are connected to the emission line driver 60.

Further, the display portion 10 is disposed with power source lines (not illustrated) common to the pixel circuits 11. More specifically, there are disposed a power source line (hereinafter, referred to as a "high-level power source line" and denoted by the reference sign ELVDD similarly to a high-level potential) for supplying a high-level potential ELVDD for driving an organic EL element (also referred to as an "electro-optical element") described later, and a power source line (hereinafter, referred to as a "low-level power source line" and denoted by the reference sign ELVSS similarly to a low-level potential) for supplying a low-level potential ELVSS for driving the organic EL element. There is also disposed an initialization line (denoted by the reference sign Vini similarly to an initialization potential) for supplying an initialization potential Vini used in an initialization action described later. These potentials are supplied from a power source circuit (not illustrated).

The display control circuit 20 outputs various control signals to the data line driver 30, the scanning line driver 50, and the emission line driver 60. More specifically, the display control circuit 20 outputs a data start pulse DSP, a data clock DCK, a display data DA, and a latch pulse LP to the data line driver 30. The display control circuit 20 also outputs a scan start pulse SSP and a scan clock SCK to the scanning line driver 50. The display control circuit 20 further outputs an emission start pulse ESP and an emission clock ECK to the emission line driver 60.

The data line driver 30 includes an m-bit shift register, a sampling circuit, a latch circuit, and m digital/analog (D/A) converters (none illustrated). The shift register includes m bistable circuits cascade-connected with each other, and synchronizes the data start pulse DSP supplied to the first stage with the data clock DCK and transfers the resultant to output the sampling pulses from respective stages. The display data DA is supplied to the sampling circuit in accordance with the output timing of the sampling pulses. The sampling circuit stores the display data DA in accordance with the sampling pulses. When one line of the display data DA is stored in the sampling circuit, the display control circuit 20 outputs the latch pulse LP to the latch circuit. The latch circuit, when having received the latch pulse LP, retains the display data DA stored in the sampling circuit. The D/A converters are provided corresponding to the m data lines D1 to Dm connected to m output terminals (not illustrated) of the data line driver 30. The D/A converters convert the display data DA held by the latch circuit into data signals that are analog voltage signals, and supply the obtained data signals to the data lines D1 to Dm.

The scanning line driver 50 drives the n scanning lines S1 to Sn. More specifically, the scanning line driver 50 includes a shift register and a buffer (not illustrated). The shift register sequentially transfers the scan start pulse SSP in synchronization with the scan clock SCK. The scanning signals which are outputs from respective stages of the shift register are sequentially supplied through the buffer to the corresponding scanning lines S1 to Sn. Pixels consisting of m pixel circuits 11 connected to a scanning line Sj are collectively selected by the active scanning signal (at a low level in the present embodiment).

The emission line driver 60 drives the n emission lines E1 to En. More specifically, the emission line driver 60 includes a shift register and a buffer (not illustrated). The shift register sequentially transfers the emission start pulse ESP in synchronization with the emission clock ECK. The emission signals which are outputs from respective stages of the shift register are supplied through the buffer to a corresponding emission line Ej (j=1 to n).

FIG. 1 illustrates, as an example, an organic EL display device in which the scanning line driver 50 is located on one end of the display portion 10 (on the left side of the display portion 10 illustrated in FIG. 1), and the emission line driver 60 is located on the other end of the display portion 10 (on the right side of the display portion 10 illustrated in FIG. 1), but the embodiment is not limited thereto. For example, the organic EL display device may have a double-sided input structure in which the scanning line driver 50 and the emission line driver 60 are located on both sides of the display portion 10. Further, to reduce the number of output terminals of the data line driver 30, a demultiplexer portion may be provided between the data line driver 30 and each of the pixel circuits. In this case, the data line driver 30 is driven by a driving method called source shared driving (SSD) that supplies the output data signals to each data line via the demultiplexer portion.

1.2 Configuration of Pixel Circuit

Figure 2:
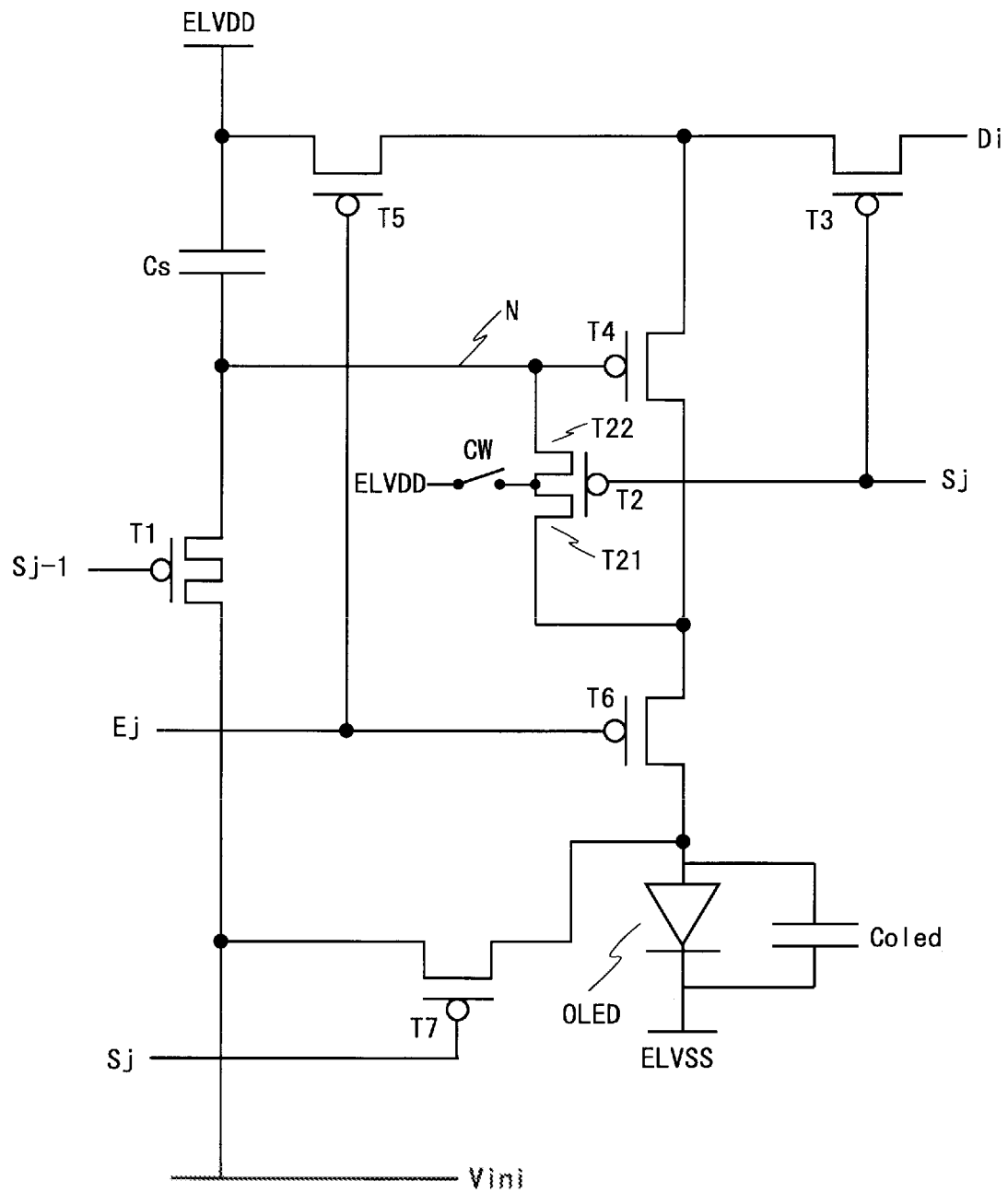
FIG. 2 is a circuit diagram illustrating a configuration of a pixel circuit formed in a display portion of the organic EL display device illustrated in FIG. 1.

A configuration of the pixel circuit 11 will now be described. FIG. 2 is a circuit diagram illustrating a configuration of the pixel circuit 11 formed in the display portion 10. As illustrated in FIG. 2, the pixel circuit 11 includes one organic EL element OLED, seven P-channel transistors T1 to T7, and one storage capacitor Cst (also referred to as a "holding capacitor"). More specifically, the pixel circuit 11 includes the first initialization transistor T1, the compensation transistor T2, the write transistor T3, the drive transistor T4, the power supply transistor T5, the light emission control transistor T6, and the second initialization transistor T7.

The drive transistor T4 includes a gate terminal, a first conduction terminal, and a second conduction terminal. The first conduction terminal of the drive transistor T4 is a conduction terminal connected to the high-level power source line ELVDD via the power supply transistor T5, and the second conduction terminal of the drive transistor T4 is a conduction terminal connected to the organic EL element OLED via the light emission control transistor T6. In the drive transistor T4, the first conduction terminal and the second conduction terminal serve as a source terminal and a drain terminal, or a drain terminal and a source terminal, respectively, in accordance with flow of a carrier. Specifically, when a hole that is a carrier flows from the first conduction terminal to the second conduction terminal, the first conduction terminal serves as the source terminal and the second conduction terminal serves as the drain terminal. Conversely, when the hole flows from the second conduction terminal to the first conduction terminal, the second conduction terminal serves as the source terminal and the first conduction terminal serves as the drain terminal.

On the pixel circuit 11, there are disposed the scanning line Sj (where j is an integer of $1 \leq j \leq n$), a preceding scanning line Sj−1 (also referred to as a "discharge line"), the emission line Ej, a data line Di (where i is an integer of $1 \leq i \leq m$), the high-level power source line ELVDD, the low-level power source line ELVSS, and the initialization line Vini. The write transistor T3 includes a gate terminal connected to the scanning line Sj and a source terminal connected to the data line Di, and supplies a data signal supplied to the data line Di in accordance with selection of the scanning line Sj to the first conduction terminal of the drive transistor T4.

The first conduction terminal of the drive transistor T4 is connected to the second conduction terminal of the write transistor T3, and the gate terminal is connected to a node N. The node N is a connection point at which a second conduction terminal of the compensation transistor T2 described later is connected to a first terminal of the storage capacitor Cst, and is charged with a voltage (data voltage) of a data signal applied to the gate terminal of the drive transistor T4. The drive transistor T4 supplies a drive current determined according to the data voltage charged in the node N to the organic EL element OLED.

The compensation transistor T2 is provided between the gate terminal and the second conduction terminal of the drive transistor T4, and adopts a dual gate structure to reduce leakage current. When the two transistors constituting this dual gate structure need to be described by differentiating one from the other, the transistor with a first conduction terminal connected to the second conduction terminal of the drive transistor T4 is referred to as a first compensation transistor T21, and the transistor with a second conduction terminal connected to the node N is referred to as a second compensation transistor T22. An electrode to which the high-level potential ELVDD is applied is disposed above a connection point of the second conduction terminal of the first compensation transistor T21 and the first conduction terminal of the second compensation transistor T22. When the connection point is irradiated with laser light, the insulating film evaporates, and the connection point and the electrode are melted and thus connected (this is also referred to as "laser melting"). Thus, the high-level potential ELVDD is supplied from the high-level power source line to the connection point of the second conduction terminal of the first compensation transistor T21 and the first conduction terminal of the second compensation transistor T22. Therefore, in the circuit diagram of the pixel circuit illustrated in the present specification, as illustrated in FIG. 2, melting and connecting the connection point and the electrode by laser inciting is, for the sake of convenience, expressed as a state in which a switch SW is turned on.

In the following description, when it is not necessary to differentiate the first compensation transistor T21 and the second compensation transistor T22, these transistors are collectively described as the compensation transistor T2. A gate terminal of the compensation transistor T2 is connected to the scanning line Sj. The compensation transistor T2 starts to be conductive when the scanning line Sj is activated (at a low level) to diode-connect the drive transistor T4. Thus, a potential Vn of the node N is lower than a data voltage Vdata by a threshold value Vth of the drive transistor T4, as expressed by Equation (1) below. This potential Vn of the node N is applied as a gate voltage Vg to the gate terminal of the drive transistor T4.

$$Vn = V\text{data} - Vth \qquad (1),$$

where Vdata is the data voltage, and Vth is the threshold voltage of the drive transistor T4.

The first initialization transistor T1 includes a gate terminal connected to the preceding scanning line Sj−1, and is provided between the gate terminal of the drive transistor T4 and the initialization line Vini. The first initialization transistor T1 is also a transistor having a dual gate structure, similar to the compensation transistor T2. When the potential of the preceding scanning line Sj−1 is at an active level, the first initialization transistor T1 is electrically conducted and applies the initialization potential Vini to the node N, thereby initializing the potential of the node N. This allows the initialization potential Vini to be applied to the gate terminal of the drive transistor T4.

The power supply transistor T5 includes a gate terminal connected to the emission line Ej, and is provided between the high-level power source line ELVDD and the drive transistor. The power supply transistor T5 supplies the high-level potential ELVDD to the first conduction terminal of the drive transistor T4 according to selection of the emission line Ej.

The light emission control transistor T6 includes a gate terminal connected to the emission line Ej, and is provided between the drive transistor T4 and the organic EL element OLED. The light emission control transistor T6 causes the second conduction terminal of the drive transistor T4 and the organic EL element OLED to be electrically conductive according to selection of the emission line Ej. Thus, a drive current having a current value controlled by the drive transistor T4 flows from the high-level power source line ELVDD through the drive transistor T4 to the organic EL element OLED.

The second initialization transistor T7 includes a gate terminal connected to the scanning line Sj, and is provided between an anode of the organic EL element OLED and the initialization line Vini. When the scanning line Sj is selected, the second initialization transistor T7 applies the initialization potential Vini to the anode of the organic EL element OLED and initializes a potential of the anode.

The first terminal of the storage capacitor Cst is connected to the node N, and a second terminal of the storage capacitor Cst is connected to the high-level power source line ELVDD. The storage capacitor Cst holds the potential of the node N when the compensation transistor T2 and the first initialization transistor T1 are both in an off state.

The organic EL element OLED includes the anode (one end of the organic EL element OLED) connected to a second conduction terminal of the light emission control transistor T6 and a cathode (the other end of the organic EL element OLED) connected to the low-level power source line ELVSS. When the drive current supplied from the drive transistor T4 flows through the organic EL element OLED, the organic EL element OLED emits light at a brightness in accordance with the current value of the drive current.

Further, a capacitor Coled that holds the voltage applied to the organic EL element OLED is provided between the anode and the cathode of the organic EL element OLED.

Note that the compensation transistor T2 and the first initialization transistor T1 are both transistors having a dual gate structure as described above. A transistor having a dual gate structure (also referred to as a "dual control terminal structure") refers to a transistor having a structure in which a common control terminal is input to the gate terminal, a conduction terminal of the first compensation transistor and a conduction terminal of the second compensation transistor are electrically connected, and a channel layer is continuously formed by the same semiconductor layer.

1.3 Normal Operation of Pixel Circuit

Figure 3:
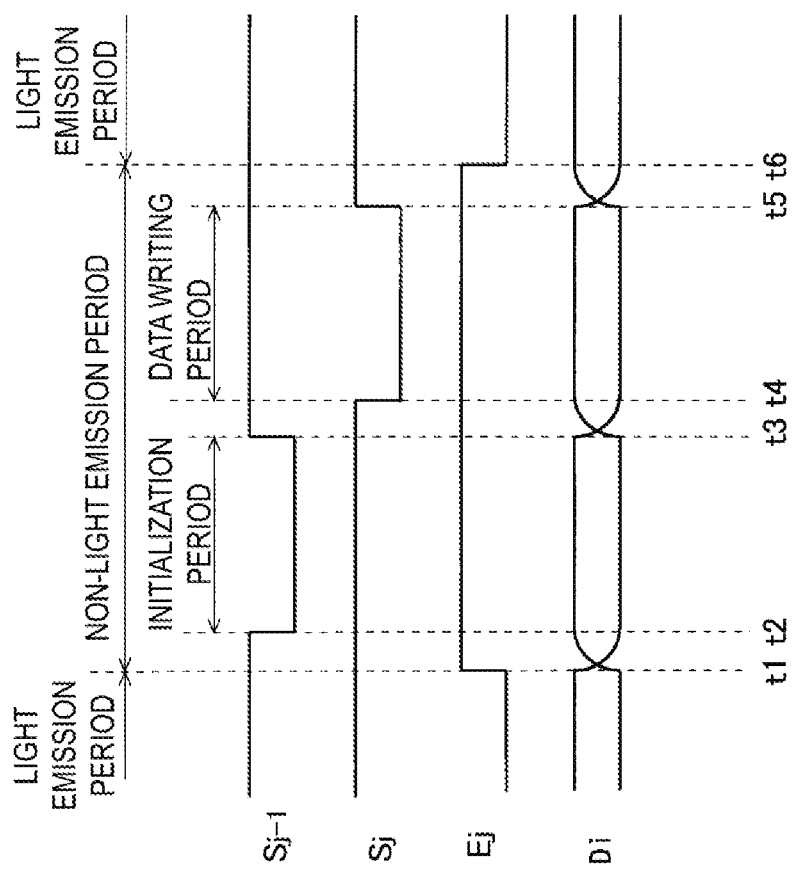
FIG. 3 is a timing chart illustrating a method for driving the pixel circuit illustrated in FIG. 2.
Figure 4:
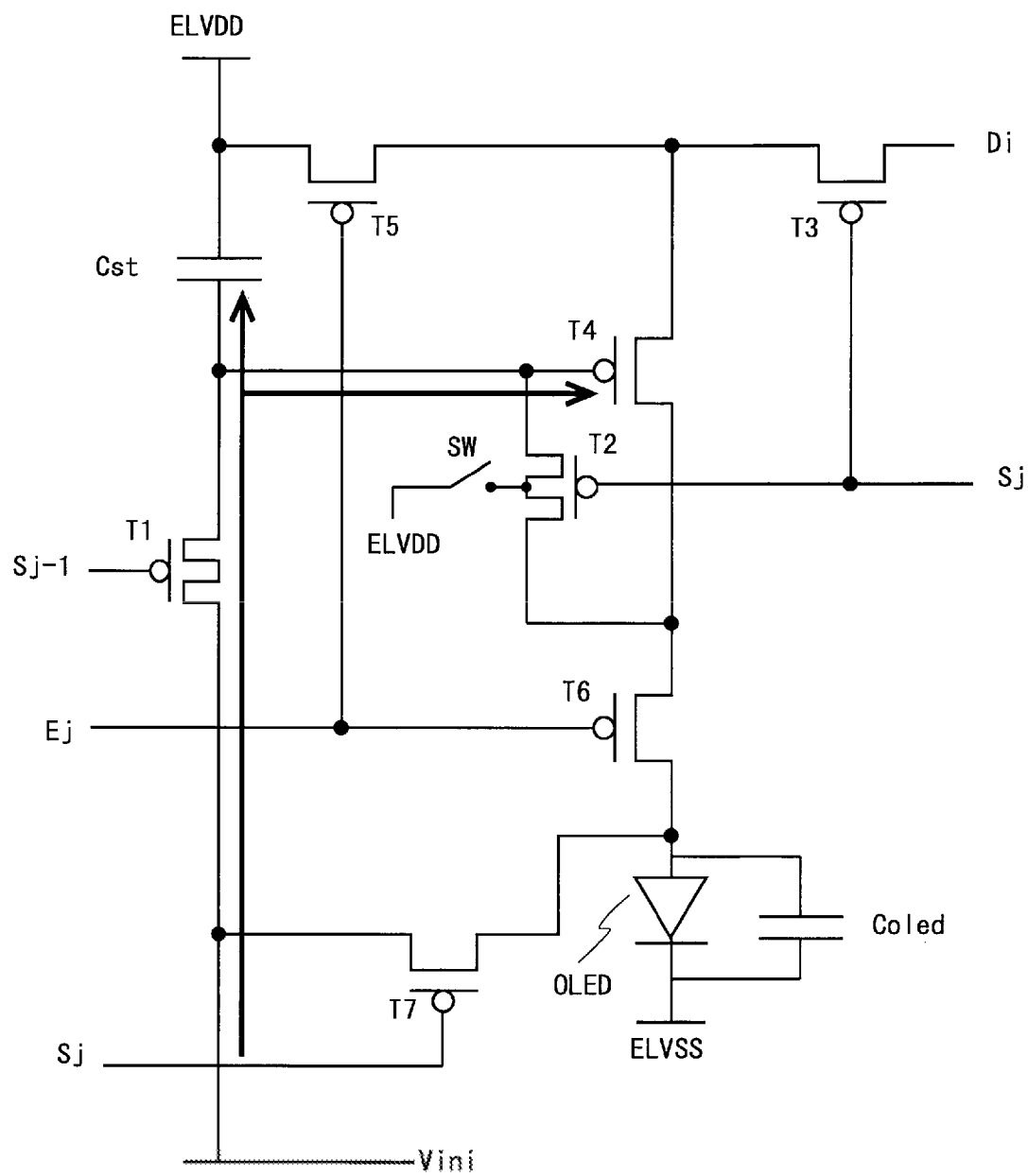
FIG. 4 is a drawing illustrating operation of the pixel circuit in an initialization period illustrated in FIG. 3.
Figure 5:
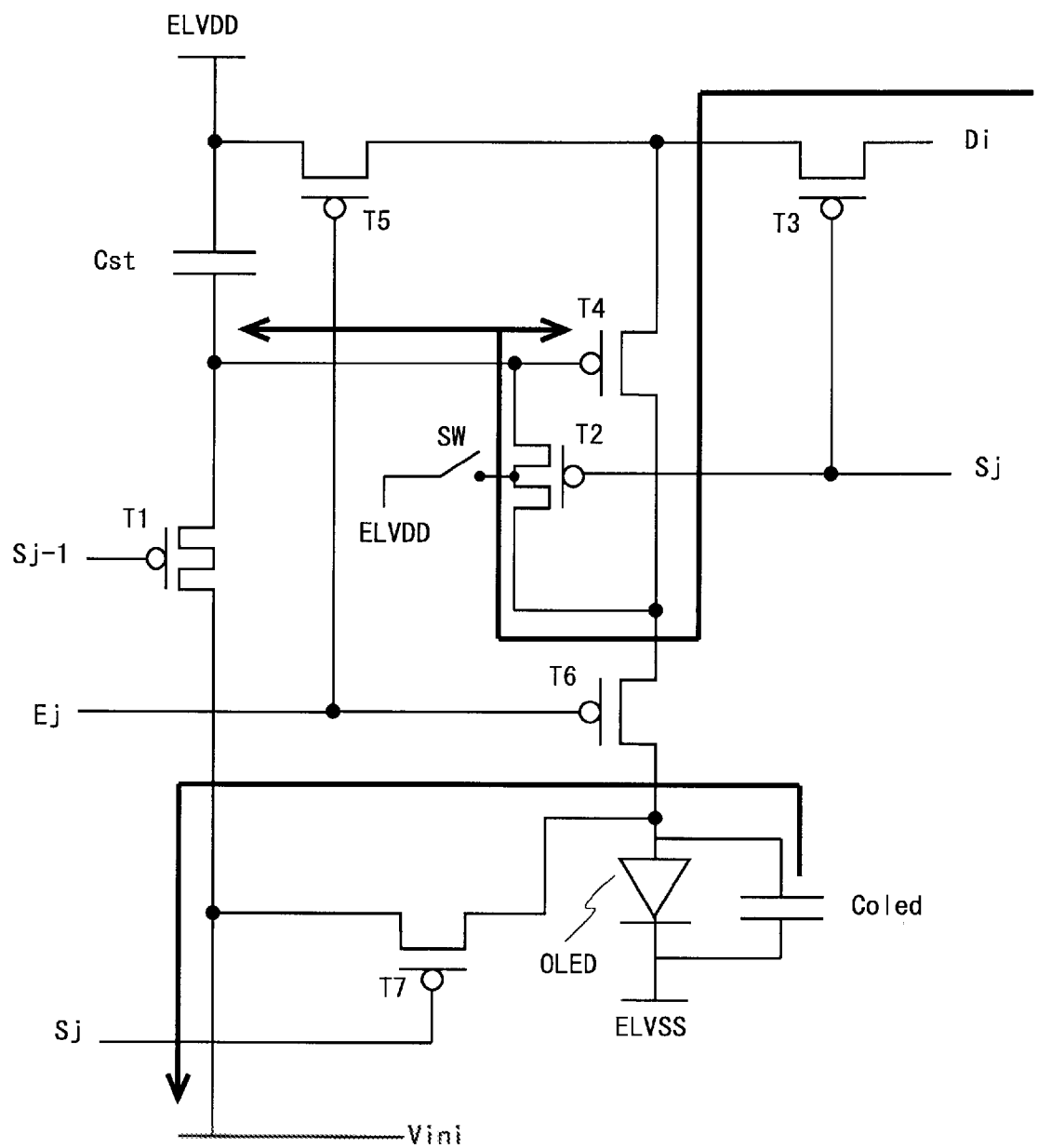
FIG. 5 is a drawing illustrating operation of the pixel circuit in a data writing period illustrated in FIG. 3.
Figure 6:
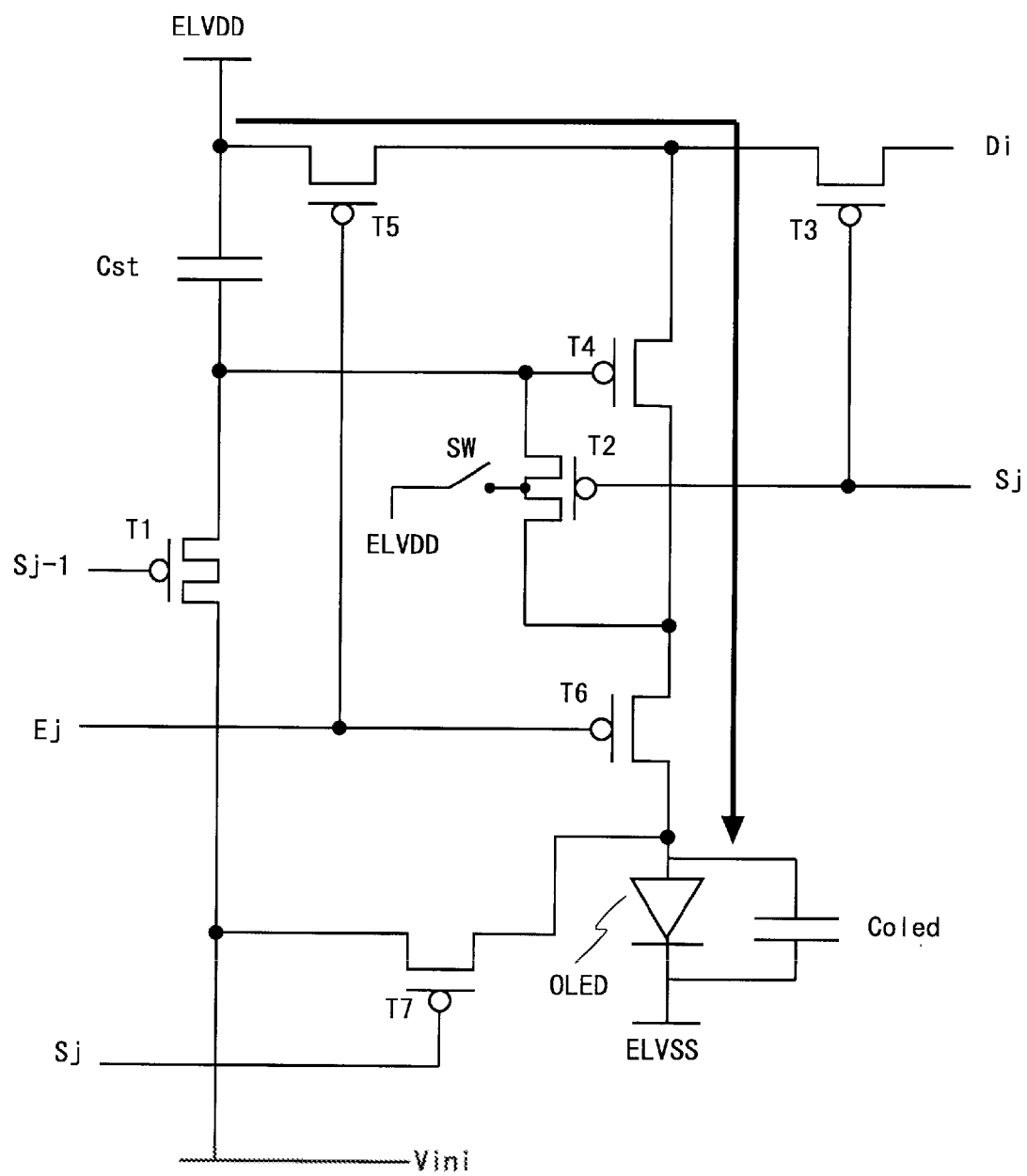
FIG. 6 is a drawing illustrating operation of the pixel circuit in a light emission period illustrated in FIG. 3.

Next, normal operation in which all seven transistors included in the pixel circuit 11 operate normally will be described. FIG. 3 is a timing chart illustrating a method for driving the pixel circuit 11 illustrated in FIG. 2. Further, FIG. 4 is a drawing illustrating operation of the pixel circuit 11 in an initialization period illustrated in FIG. 3, FIG. 5 is a drawing illustrating operation of the pixel circuit 11 in a data writing period illustrated in FIG. 3, and FIG. 6 is a drawing illustrating operation of the pixel circuit 11 in a light emission period illustrated in FIG. 3.

As illustrated in FIG. 3, at a time t1, the potential of the emission line Ej changes from a high level to a low level. Furthermore, at a time t2, the potential of the preceding scanning line Sj−1 changes from a high level to a low level. As a result, as illustrated in FIG. 4, the first initialization transistor T1 is turned to an on state, and the initialization potential Vini is supplied from the initialization line Vini via the first initialization transistor T1 to the storage capacitor Cst and the node N and applied to the gate terminal of the drive transistor T4. Therefore, the potential of the gate terminal of the drive transistor T4 is initialized, and the potential of the node N of the pixel circuit 11 drops from the data voltage charged in the scanning period of the previous stage to the initialization potential Vini, which is even lower than the low level. Note that, at this time, the potential of the low level supplied to the preceding scanning line Sj−1 is the same level as the potential of the low level applied to the scanning line in the scanning period of the pixel of the previous stage.

At a time t3, the potential of the preceding scanning line Sj−1 changes from a low level to a high level, and the first initialization transistor T1 is turned to an off state. Further, the data line driver 30 starts supplying the data signal to the data line Di. In this way, the period from the time t2 to the time t3 is an initialization period for initializing the storage capacitor Cst and the node N.

At a time t4, the potential of the scanning line Sj changes from a high level to a low level. Further, the potential of the data line Di becomes the potential of the data signal. As a result, as illustrated in FIG. 5, the write transistor T3 and the compensation transistor T2 are each turned to an on state, and the data signal is written to the node N via the write transistor T3, the drive transistor T4, and the compensation transistor T2. Further, the threshold voltage of the drive transistor T4 is compensated. At this time, the storage capacitor Cst is charged with a potential that is lower than the potential of the data signal by the threshold voltage of the drive transistor T4. The low-level potential is also applied to the gate terminal of the second initialization transistor T7 connected to the scanning line Sj, and thus the second initialization transistor T7 is also turned to an on state. Thus, the voltage charged to the capacitor Coled in order to cause the organic EL element OLED to emit tight is discharged to the initialization line Vini via the second initialization transistor T7.

At a time t5, the potential of the scanning line Sj changes from a low level to a high level. Thus, the write transistor T3 and the compensation transistor T2 are each turned to an off state, and writing of the data signal to the node N is stopped. In this way, the period from the time t4 to the time t5 is a data writing period in which a data signal charged to a data line is written to the node N.

At a time t6, the emission signal changes from a high level to a low level. Thus, as illustrated in FIG. 6, the light emission control transistor T6 is turned to an on state, and a current having a current value controlled by the drive transistor T4 flows from the high-level power source line ELVDD to the organic EL element OLED through the power supply transistor T5, the drive transistor T4, and the light emission control transistor T6. As a result, the organic EL element OLED emits light at a brightness in accordance with the data signal.

1.4 Repair

When the seven transistors included in the pixel circuit 11 illustrated in FIG. 2 operate normally, each of the pixel circuits 11 emits light at a brightness in accordance with the data signal as described above. However, the pixel circuit 11 may not operate normally due to any one of the seven transistors being in a normally-on state or a normally-off state. The pixel circuit 11 including a transistor that is no longer operating normally becomes, for example, a black dot when always turned off, or a bright dot when always lit. Further, because a particular transistor in the pixel circuit 11 no longer operates normally, other pixel circuits 11 connected to the same high-level power source line ELVDD as the faulty pixel circuit 11 may simultaneously malfunction, thereby resulting in a line defect.

In the case of a display panel including a small number of pixel circuits 11 having such a defect, the defect becomes less noticeable when repair is done such that the pixel circuits 11 that are not operating normally are made to always appear as black dots. When the number of repaired pixel circuits is small, practical use is often unproblematic with such a repaired display panel. Thus, compared to a case in which a defective display panel is discarded without being repaired, production yield of the display panel is improved, which makes it possible to reduce the manufacturing cost of the display panel. Therefore, repairs are made to make use of defective display panels.

1.4.1 Inspection of Display Panel

Each pixel circuit formed in the display panel is inspected after the pixel circuits are formed in the display panel. When a pixel circuit with poor display such as a black dot, a bright dot, or a line defect is detected during inspection of the pixel circuits, the malfunctioning transistor among the transistors constituting the pixel circuit and a failure mode of that transistor are identified. Next, a study is conducted to identify whether the circuit including the transistor for which the failure mode was identified can be converted into a black dot through repair and, if black dot conversion is determined to be possible, the circuit is repaired. The repaired pixel circuit is then once again inspected to confirm conversion into a black dot. In this way, the repaired display panel includes pixel circuits that operate normally as well as pixel circuits converted into black dots.

1.4.2 Supply of High-Level Potential

The repair described in the present embodiment is repair performed by connecting the high-level power source line ELVDD to a region interposed between the first compensation transistor T21 and the second compensation transistor T22. Prior to describing the method for repair, the reason for connecting the high-level power source line ELVDD to the region interposed between the first compensation transistor T21 and the second compensation transistor T22 in the present embodiment will be described.

First, a case in which the high-level power source line ELVDD is connected to a second conduction terminal of the second compensation transistor T22 will be described. In this case, when the potential of the preceding scanning line Sj−1 changes from a high level to a low level, thereby turning the first initialization transistor T1 to an on state, a problem arises that the high-level power source line ELVDD and the initialization line Vini are short-circuited.

Next, a case in which the high-level power source line ELVDD is connected to a first conduction terminal of the first compensation transistor T21 will be described. In this case, when the emission line Ej changes from a high level to a low level, thereby turning the light emission control transistor T6 to an on state, the high-level potential ELVDD is applied to the anode of the organic EL element OLED. As a result, current flows from the anode to the cathode of the organic EL element OLED, and a problem arises that the organic EL element, which is to be converted into a black dot, emits light.

Therefore, in the present embodiment, to ensure that such problems do not occur, the high-level power source line ELVDD is connected to a region on the semiconductor layer interposed between the first compensation transistor T21 and the second compensation transistor T22. Note that the region of the semiconductor layer is an impurity region doped with impurities to ensure that the high-level power source line ELVDD is ohmic-connected. More specifically, because the transistors constituting the pixel circuit 11 are P-channel transistors, the impurity region is a P-type impurity region.

1.4.3 Repair Method

In the present embodiment, the repair made when the second initialization transistor T7 is in a normally-on state will be described. Before the repair is described, a problem when the second initialization transistor T7 is in a normally-on state will be described.

Figure 7:
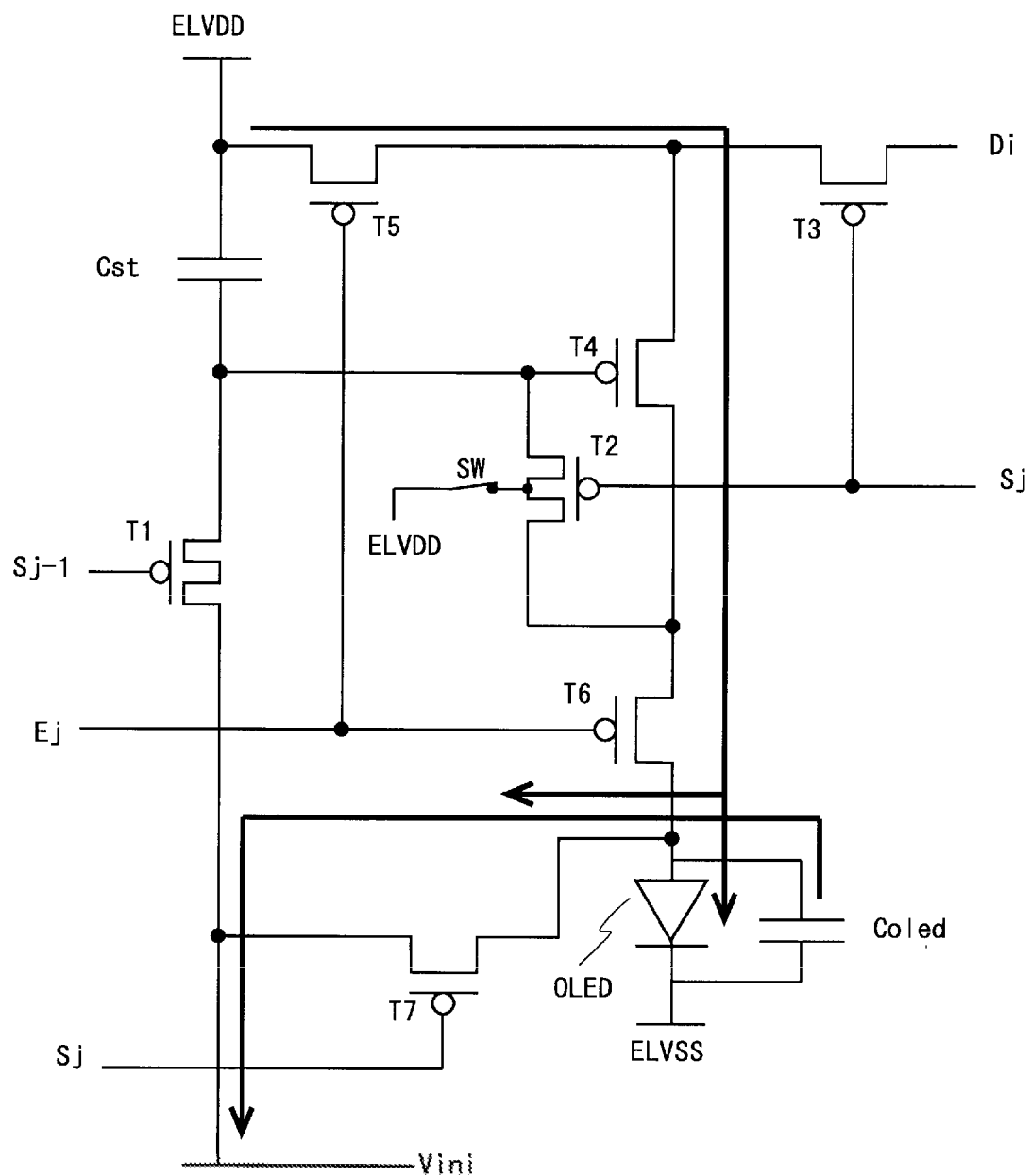
FIG. 7 is a drawing illustrating a problem when a write transistor of e pixel circuit illustrated in FIG. 2 is in a normally-on state.

FIG. 7 is a drawing illustrating the problem when the second initialization transistor T7 of the pixel circuit 11 illustrated in FIG. 2 is in a normally-on state. With reference to FIG. 3 and FIG. 7, at the time t4, the potential of the scanning line Sj changes from a high level to a low level, thereby turning the second initialization transistor T7, the first compensation transistor T21, and the second compensation transistor T22 to an on state. This causes the data signal charged to the data line Di to be written to the node N through the write transistor T3, the drive transistor T4, the first compensation transistor T21, and the second compensation transistor T22, and be applied to the gate terminal of the drive transistor T4. Then, when the potential of the emission line Ei changes from a high level to a low level, the power supply transistor T5 and the light emission control transistor T6 are turned to an on state, and a current having a current value corresponding to the data signal flows from the high-level power source line ELVDD to the organic EL element OLED.

Because the second initialization transistor T7 is in a normally-on state at this time, the high-level power source line ELVDD and the initialization line Vini are short-circuited, and current also flows to the initialization line Vini. As a result, the current flowing to the organic EL element OLED is reduced, and the organic EL element OLED emits light at a brightness different from the brightness corresponding to the data signal. Furthermore, the high-level potential ELVDD of the high-level power source line ELVDD also varies due to influence of the short circuit between the high-level power source line ELVDD and the initialization line Vini, and an abnormal gray scale occurs simultaneously in other pixel circuits connected to the high-level power source line ELVDD. When an abnormal gray scale occurs simultaneously in a plurality of pixel circuits connected to the same high-level power source line ELVDD as described above, a viewer visually recognizes the abnormality as a line defect.

Figure 8:
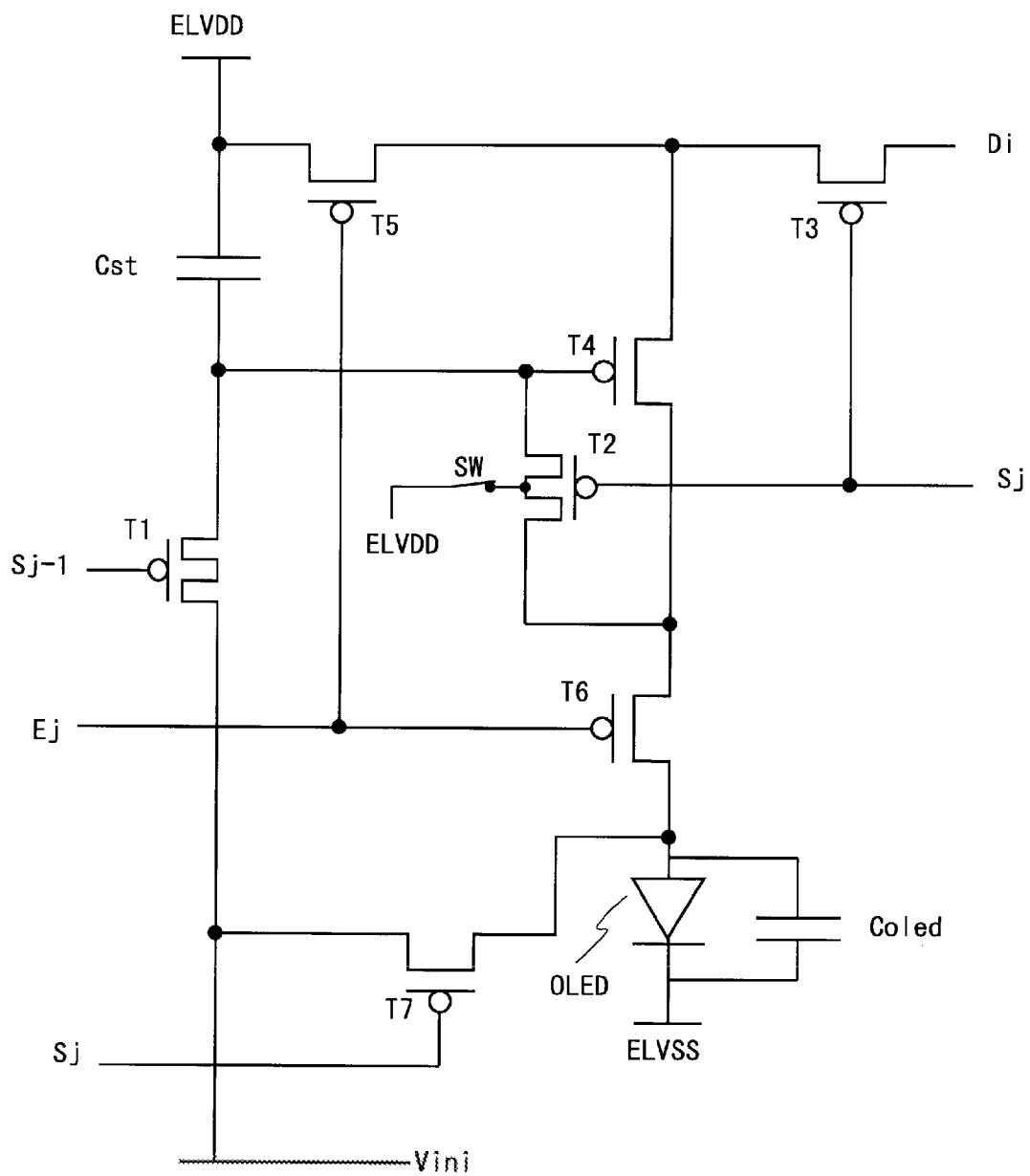
FIG. 8 is a drawing illustrating a first procedure of a repair made to improve malfunction of a second initialization transistor illustrated in FIG. 7.
Figure 9:
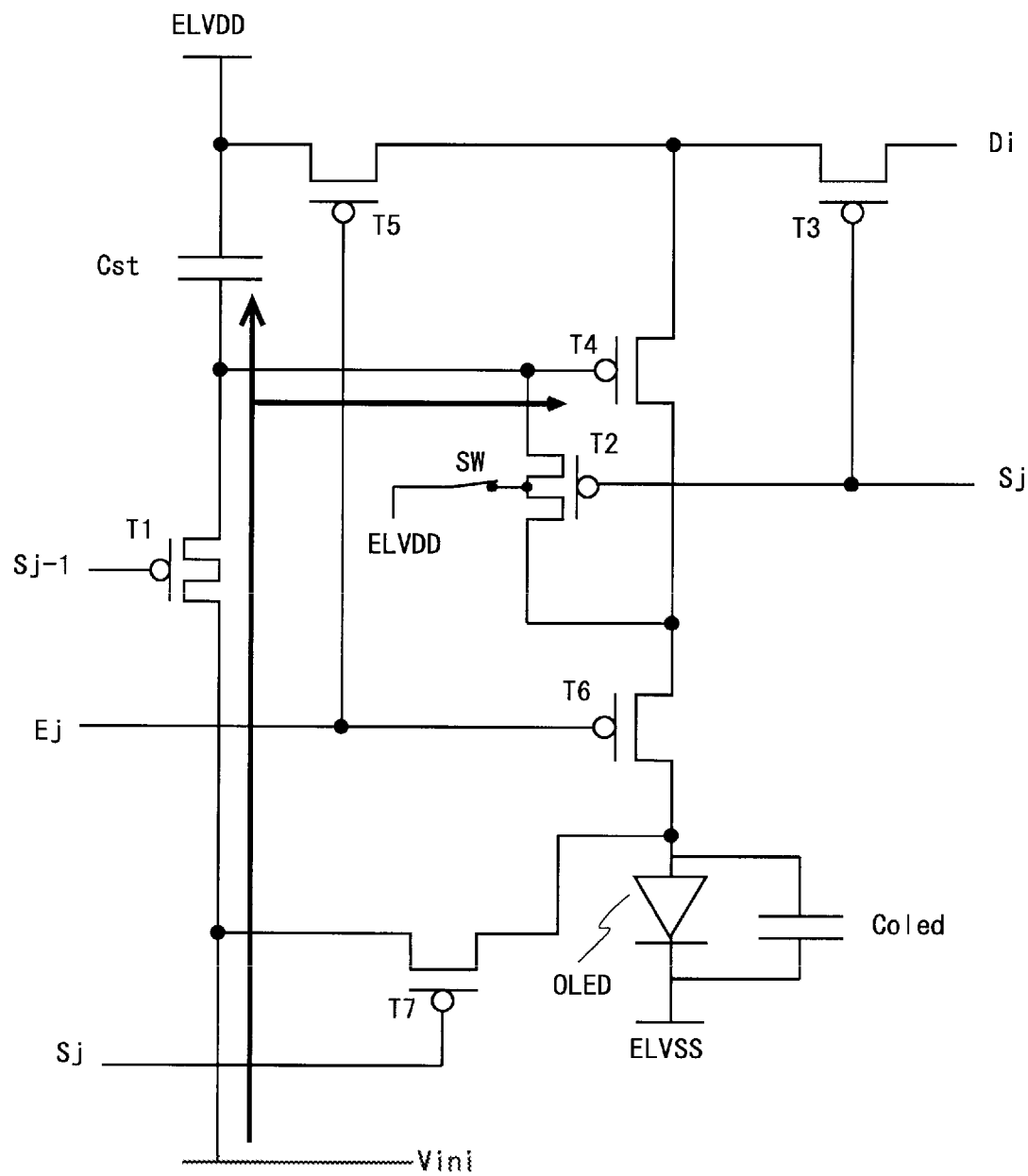
FIG. 9 is a drawing illustrating a procedure of the repair made in continuation of the procedure illustrated in FIG. 8 to improve malfunction of the second initialization transistor illustrated in FIG. 7.

FIG. 8 to FIG. 11 are drawings sequentially illustrating the procedure of the repair made to improve malfunction of the second initialization transistor T7 illustrated in FIG. 7. First, as illustrated in FIG. 8, the connection point of the second conduction terminal of the first compensation transistor T21 and the first conduction terminal of the second compensation transistor T22 is irradiated with laser light, thereby evaporating the insulating film and connecting the connection point to an electrode having the high-level potential ELVDD. Thus, the high-level potential ELVDD is applied to the connection point interposed between the first compensation transistor T21 and the second compensation transistor T22. Next, when the potential of the preceding scanning line Sj−1 changes from a high level to a low level, thereby turning the first initialization transistor T1 to an on state, the initialization potential Vini is applied to the storage capacitor Cst and the gate terminal of the drive transistor T4, as illustrated in FIG. 9. As a result, the potential of the storage capacitor Cst and the gate terminal of the drive transistor T4 is initialized.

Figure 10:
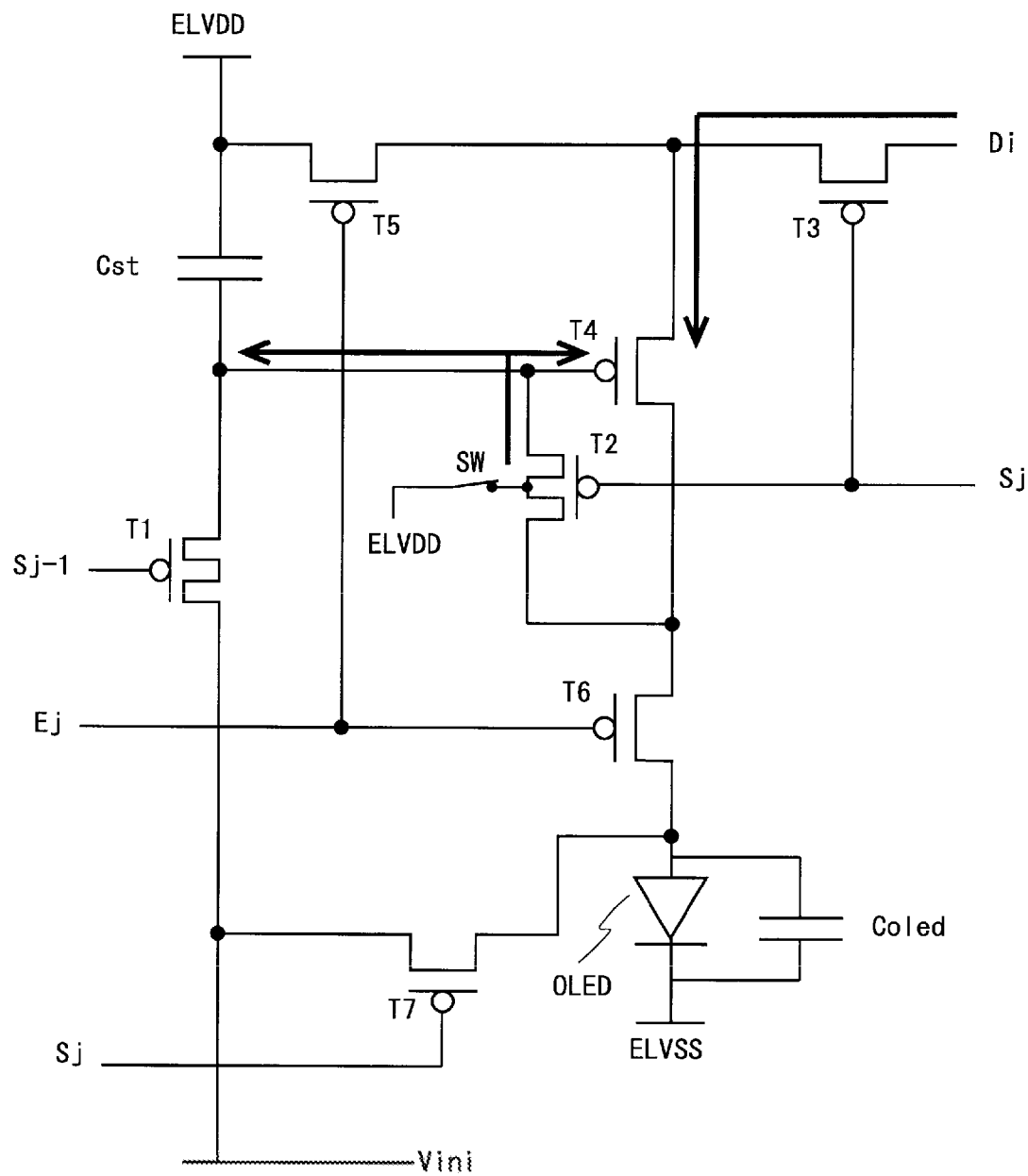
FIG. 10 is a drawing sequentially illustrating a procedure of the repair made in continuation of the procedure illustrated in FIG. 9 to improve malfunction of the second initialization transistor illustrated in FIG. 7.
Figure 11:
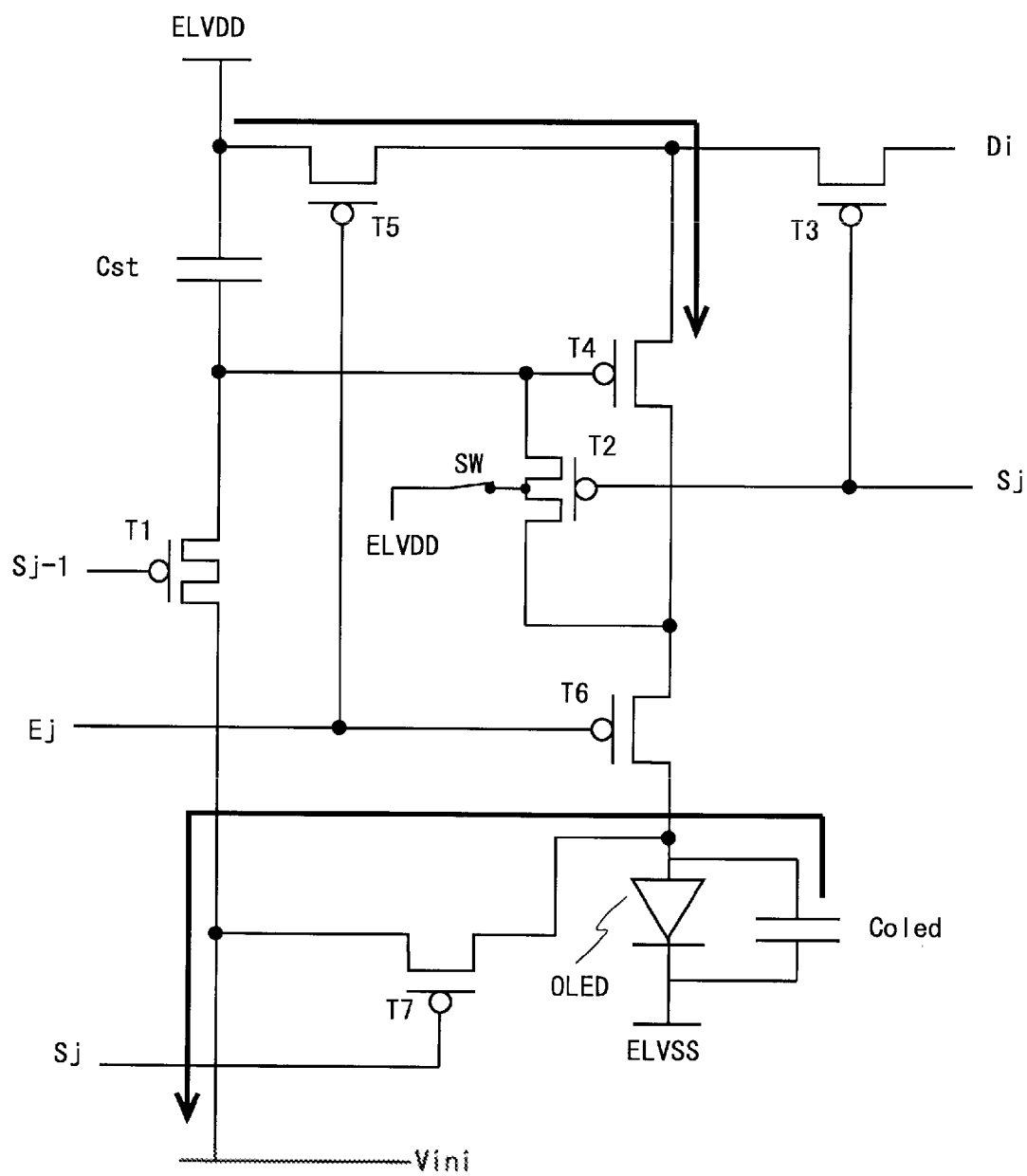
FIG. 11 is a drawing sequentially illustrating a procedure of the repair made in continuation of the procedure illustrated in FIG. 10 to improve malfunction of the second initialization transistor illustrated in FIG. 7.

Next, when the potential of the scanning line Sj changes from a high level to a low level, the first and second compensation transistors T21, T22 are each turned to an on state, and the high-level potential ELVDD applied to the connection point of the first compensation transistor T21 and the second compensation transistor T22 is applied to the gate terminal of the drive transistor T4 via the node N, as illustrated in FIG. 10. This turns the drive transistor T4 to an off state. Because the write transistor T3 is also turned to an on state at this time, a data signal is applied from the data line Di to the first conduction terminal of the drive transistor T4. However, because the drive transistor T4 is in an off state, the data signal cannot pass through the drive transistor T4. Subsequently, if the potential of the emission line Ej changes from a high level to a low level, the power supply transistor T5 and the light emission control transistor T6 are each turned to an on state, but the drive transistor T4 is in an off state, as illustrated in FIG. 11. Therefore, the current does not flow from the high-level power source line ELVDD to the organic EL element OLED through the drive transistor T4. In this case, the organic EL element OLED is turned to a normally-off state, and thus the faulty pixel circuit that turned the second initialization transistor T7 to a normally-on state can be converted into a black dot.

Furthermore, even if the potential of the emission line Ej changes from a high level to a low level to turn the second initialization transistor T7 to an on state, the drive transistor T4 is in an off state and thus the high-level power source line ELVDD and the initialization line Vini are not short-circuited. In this case, the potential of the high-level power source line does not fluctuate due to the influence of the potential of the initialization line Vini, and thus an abnormal gray scale does not occur in other pixel circuits connected to the same high-level power source line ELVDD. Thus, according to the present embodiment, a pixel circuit in which the second initialization transistor T7 is in a normally-on state can be converted into a black dot by repairing the pixel circuit. Furthermore, an abnormal gray scale does not occur in other pixel circuits connected to the same high-level power source line ELVDD as the pixel circuit, and thus the viewer does not visually recognize a line defect.

1.5 Wiring Line Layout

Each wiring line layout that allows the above-described repair will now be described. In the following, before description is made of first to fourth wiring line layouts, each of which illustrates a positional relationship between a semiconductor layer SI provided with the first compensation transistor T21 and the second compensation transistor T22 formed therein, a scanning line SCAN configured to also function as gate terminals of the first compensation transistor T21 and the second compensation transistor T22, the data line D, and the high-level power source line ELVDD, the wiring lines used in each wiring line layout will be described.

The semiconductor layer SI configured to function as a channel region and a source/drain region of a transistor, or function as a wiring line for connecting each transistor, is formed on an insulating substrate 90. A gate insulating film 91 composed of an inorganic insulating film such as a silicon oxide film or a silicon nitride film, for example, is formed covering the semiconductor layer SI. The scanning line SCAN composed of a first metal layer and also functioning as a gate terminal of some of the transistors is formed on the gate insulating film 91.

A first interlayer insulating film 92 composed of an inorganic insulating film is formed covering the scanning line SCAN. A second metal layer used as an electrode of the storage capacitor Cst, or used as a repair wiring line REP, is formed on the first interlayer insulating film 92. A second interlayer insulating film 93 composed of an inorganic insulating film is formed covering the second metal layer. The data line D and the high-level power source line ELVDD composed of a third metal layer are formed on the second interlayer insulating film 93.

Further, the high-level power source line ELVDD is connected to a connection point of the semiconductor layer SI to which the first compensation transistor T21 and the second compensation transistor T22 are connected, as described later. A region of the semiconductor layer SI to which the high-level power source line ELVDD is connected is an impurity region DSI doped with P-type impurities. Thus, the high-level power source line ELVDD is ohmic-connected to the semiconductor layer SI.

1.5.1 First Wiring Line Layout

Figure 12:
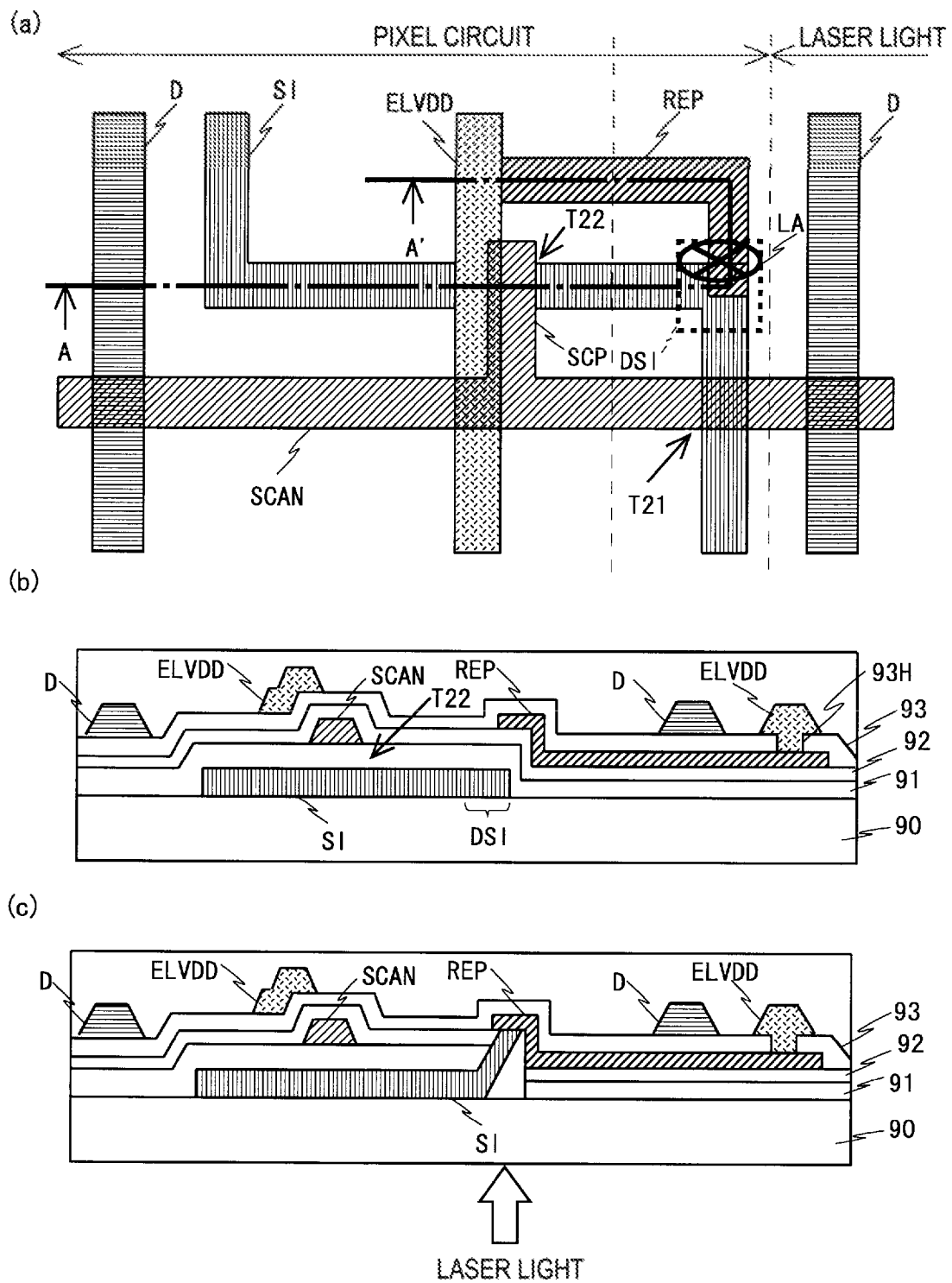
FIGS. 12(a) to 12(c) are drawings illustrating a first wiring line layout for making a repair, where

FIGS. 12(a) to 12(c) are drawings illustrating the first wiring line layout for making a repair, where FIG. 12(a) is a plan view of a portion of the wiring line layout, FIG. 12(b) is a cross-sectional view along the arrow A-A' of the wiring line layout before repair, and FIG. 12(c) is a cross-sectional view along the arrow A-A' of the wiring line layout after repair.

As illustrated in FIG. 12(a), in the pixel circuit, the data line D, the high-level power source line ELVDD, and the data line D of another pixel circuit adjacent to the pixel circuit are disposed in parallel, and the scanning line SCAN is disposed intersecting these. The scanning line SCAN includes a projection SCP that branches from the scanning line SCAN and extends parallel to and partially superimposed onto the high-level power source line ELVDD.

The semiconductor layer SI is formed intersecting the projection SCP of the scanning line SCAN and the scanning line SCAN one time each. The first compensation transistor T21 is formed at a position where the scanning line SCAN intersects the semiconductor layer SI, and the second compensation transistor T22 is formed at a position where the projection SCP of the scanning line SCAN intersects the semiconductor layer SI. Furthermore, the repair wiring line REP used when making a repair is formed with one end thereof superimposed onto the impurity region DSI formed in the semiconductor layer SI, and the other end superimposed onto the high-level power source line ELVDD. Note that the high-level power source line ELVDD may be referred to as a "first power source wiring line". In this case, the repair wiring line REP is formed without being superimposed onto the data line D.

Next, the repair method will be described. As illustrated in FIG. 12(b), the gate insulating film 91 is formed covering the semiconductor layer SI formed on the insulating substrate 90. The scanning line SCAN is formed on the gate insulating film 91, and the first interlayer insulating film 92 is formed covering the scanning line SCAN. The repair wiring line REP composed of the first metal layer is formed on the first interlayer insulating film. The second interlayer insulating film 93 is formed covering the repair wiring line REP. The high-level power source line ELVDD and the data line D composed of the second metal layer are formed on the second interlayer insulating film. One end of the repair wiring line REP is connected to the high-level power source line ELVDD by a contact hole 93H formed in the second interlayer insulating film. The other end of the repair wiring line REP is disposed on an insulating film composed of the gate insulating film 91 and the first interlayer insulating film 92 layered on an upper portion of the impurity region DSI of the semiconductor layer SI interposed between the first compensation transistor T21 and the second compensation transistor T22.

As illustrated in FIG. 12(c), in order to connect the semiconductor layer SI to the repair wiring line REP, the impurity region DSI is irradiated with laser light from a rear face side of the insulating substrate 90. At this time, the semiconductor layer SI is eliminated when the output of the laser light is too large, and the semiconductor layer SI cannot be connected to the repair wiring line REP when the output of the laser light is too small. Therefore, an irradiation region LA within the impurity region DSI of the semiconductor layer SI is irradiated from the rear face side of the insulating substrate 90 with laser light having an output configured to evaporate each insulating film provided between the semiconductor layer SI and the repair wiring line REP and melt and thus reliably connect the semiconductor layer SI and the repair wiring line REP. Thus, the gate insulating film 91 and the first interlayer insulating film 92 of the impurity region DSI are eliminated, and the semiconductor layer SI is connected to the repair wiring line REP. As a result, the gate terminal of the drive transistor T4 becomes the high-level potential ELVDD, and thus the drive transistor T4 is turned to an off state and the pixel circuit is converted into a black dot.

Note that the high-level potential ELVDD applied to the impurity region DSI of the semiconductor layer SI, which is the connection point of the first compensation transistor T21 and the second compensation transistor T22, is referred to as an "off potential". Further, in the first wiring line layout, the high-level power source line ELVDD connected to the repair wiring line REP that applies the off voltage to the impurity region DSI may be referred to as an "off-voltage supply wiring line".

1.5.2 Second Wiring Line Layout

FIGS. 13(a) to 13(c) are drawings illustrating the second wiring line layout for making a repair, where FIG. 13(a) is a plan view of a portion of the wiring line layout, FIG. 13(b) is a cross-sectional view along the arrow A-A' of the wiring line layout before repair, and FIG. 13(c) is a cross-sectional view along the arrow A-A' of the wiring line layout after repair.

As illustrated in FIG. 13(a), in the pixel circuit, the data line D and the high-level power source line ELVDD are disposed in parallel, and the scanning line SCAN is formed intersecting these. The scanning line SCAN includes the projection SCP that branches from the scanning line SCAN and extends parallel to the high-level power source line ELVDD, in a region interposed between the high-level power source line ELVDD and the data line D.

The semiconductor layer SI is disposed intersecting the projection SCP of the scanning line SCAN and the scanning line SCAN one time each. The first compensation transistor T21 is formed at a position where the scanning line SCAN intersects the semiconductor layer SI, and the second compensation transistor T22 is formed at a position where the projection SCP of the scanning line SCAN intersects the semiconductor layer SI. Note that, unlike the first wiring line layout, a repair wiring line is not provided.

Next, the repair method will be described. As illustrated in FIG. 13(b), the gate insulating film 91 is formed covering the semiconductor layer SI formed on the insulating substrate 90. The scanning line SCAN is formed on the gate insulating film 91, and the first and second interlayer insulating films 92, 93 are formed covering the scanning line SCAN. Furthermore, the high-level power source line ELVDD and the data line D composed of the second metal layer are formed on the second interlayer insulating film 93. Therefore, the impurity region DSI of the semiconductor layer SI interposed between the first compensation transistor T21 and the second compensation transistor T22 in which the gate terminal is formed by the scanning line SCAN, and the high-level power source line ELVDD are separated by the gate insulating film 91 and the first and second interlayer insulating films 92, 93.

As illustrated in FIG. 13(c), the irradiation region LA within the impurity region DSI is irradiated from the rear face side of the insulating substrate 90 with laser tight having an output configured to evaporate each insulating film provided between the semiconductor layer SI and the high-level power source line ELVDD and melt and thus reliably connect the semiconductor layer SI and the repair wiring line REP connected to the high-level power source line ELVDD. Thus, the gate insulating film 91 and the first and second interlayer insulating films 92, 93 on the impurity region DSI are evaporated, and the impurity region DSI of the semiconductor layer SI and the high-level power source lines ELVDD are melted and thus connected. As a result, the high-level potential ELVDD is applied from the high-level power source line ELVDD to the gate terminal of the drive transistor T4, and thus the drive transistor T4 is turned to an off state and the pixel circuit is converted into a black dot. Note that, in the second wiring line layout, the high-level power source line ELVDD that applies the off voltage to the impurity region DSI may be referred to as the "off-voltage supply wiring line".

1.5.3 Third Wiring Line Layout

Figure 14:
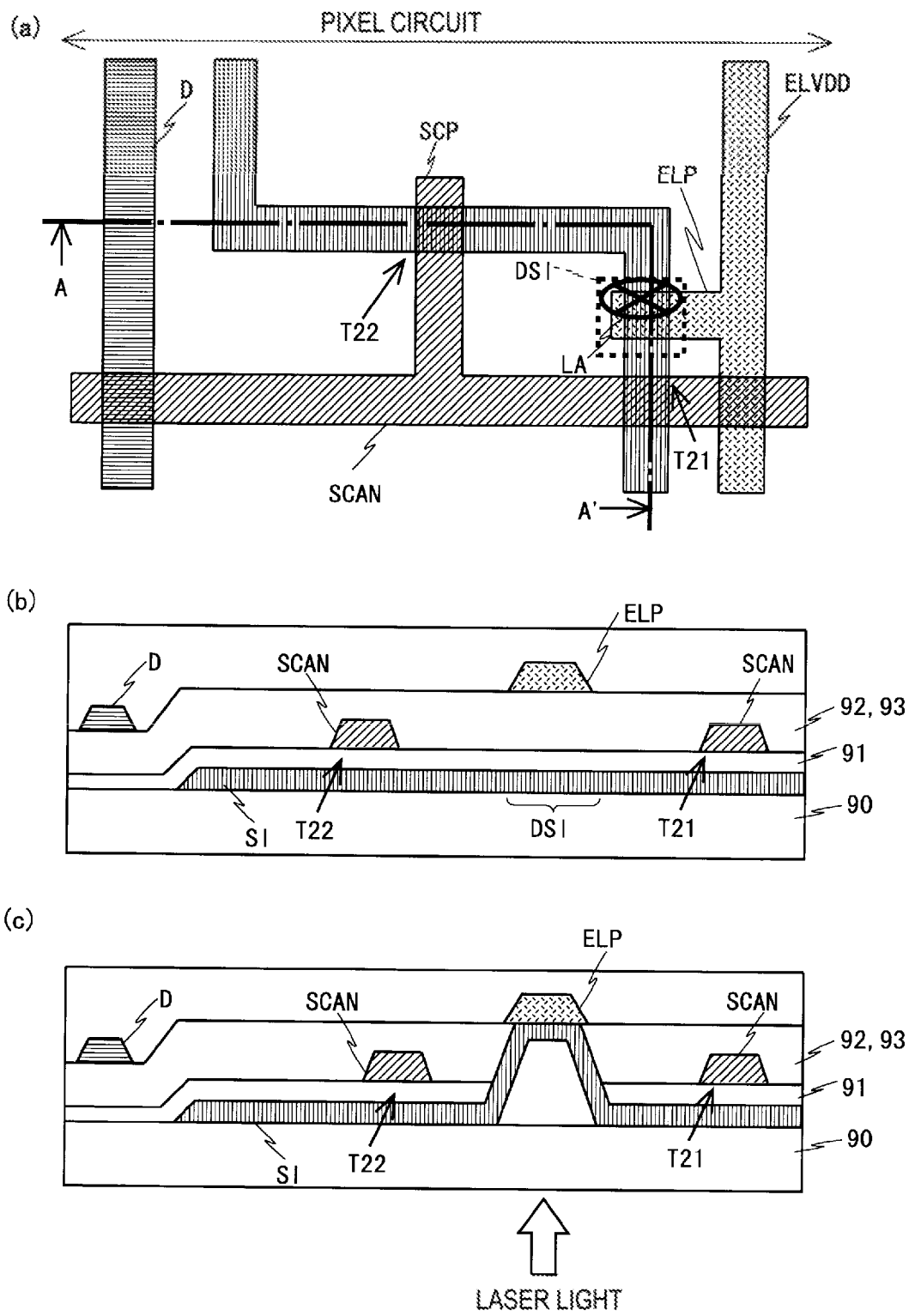
FIGS. 14(a) to 14(c) are drawings illustrating a third wiring line layout for making a repair, where

FIGS. 14(a) to 14(c) are drawings illustrating the third wiring line layout for making a repair, where FIG. 14(a) is a plan view of a portion of the wiring line layout, FIG. 14(b) is a cross-sectional view along the arrow A-A' of the wiring line layout before repair, and FIG. 14(c) is a cross-sectional view along the arrow A-A' of the wiring line layout after repair.

Figure 13:
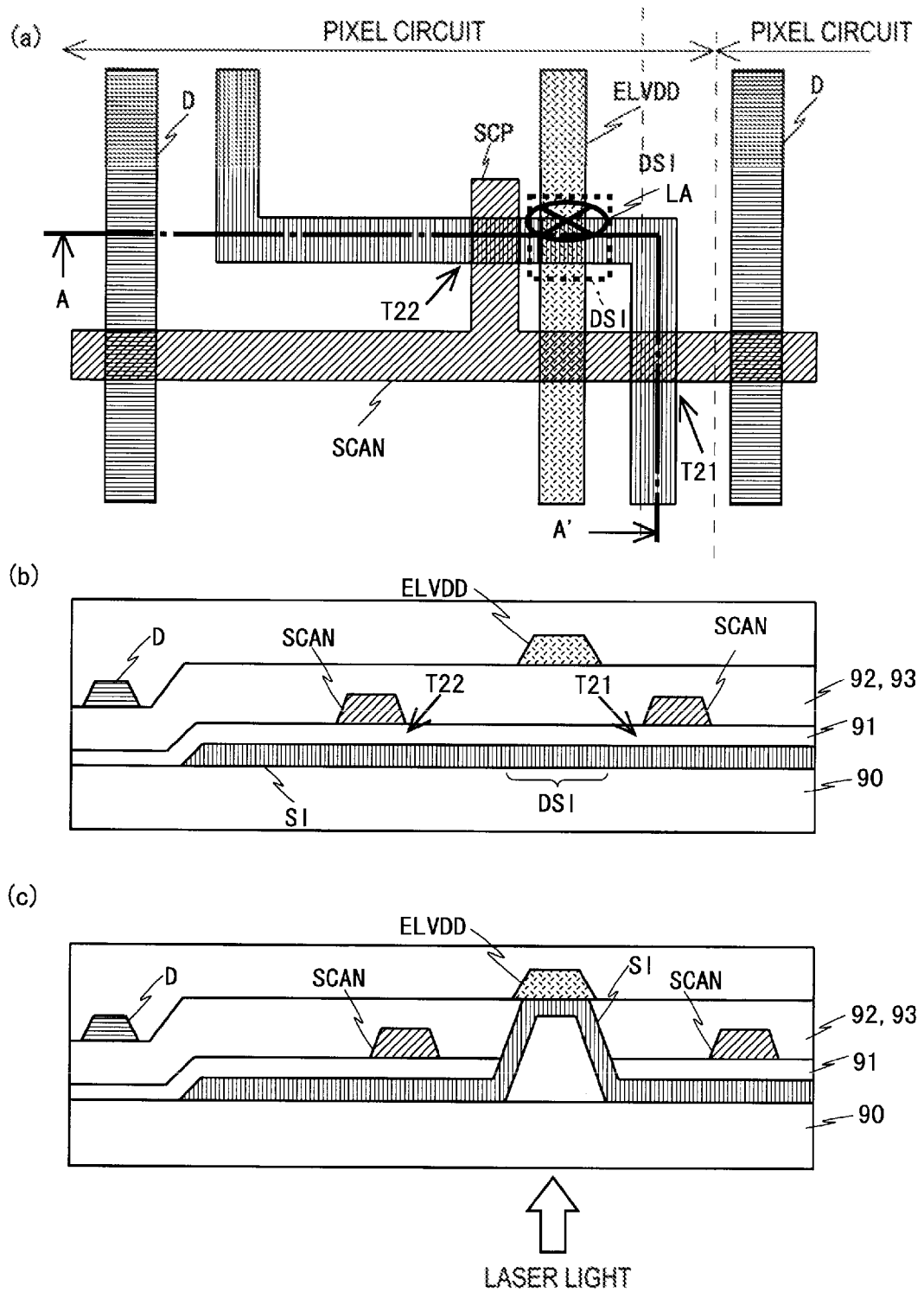
FIGS. 13(a) to 13(c) are drawings illustrating a second wiring line layout for making a repair, where

As illustrated in FIG. 14(a), in the third wiring line layout, the high-level power source line ELVDD in the third wiring line layout in FIG. 13 is disposed on a side opposite to the projection SCP of the scanning line SCAN, with the semiconductor layer SI interposed between the high-level power source line ELVDD and the projection SCP. The high-level power source line ELVDD includes a projection ELP that branches from the high-level power source line ELVDD and extends parallel to the scanning line SCAN.

The semiconductor layer SI is formed intersecting the projection SCP of the scanning line SCAN and the scanning line SCAN one time each. The first compensation transistor T21 is formed at a position where the scanning line SCAN intersects the semiconductor layer SI, and the second compensation transistor T22 is formed at a position where the projection SCP of the scanning line SCAN intersects the semiconductor layer SI. The projection of the high-level power source line ELVDD intersects the semiconductor layer SI and is connected to the semiconductor layer SI as described later. The arrangement of the other wiring lines is the same as in the case illustrated in FIG. 13, and thus a description thereof is omitted.

Next, the repair method will be described. As illustrated in FIG. 14(b), the gate insulating film 91 is formed covering the semiconductor layer SI formed on the insulating substrate 90. The scanning line SCAN is formed on the gate insulating film 91, and the first and second interlayer insulating films 92, 93 are formed covering the scanning line SCAN. The high-level power source line ELVDD, the projection ELP thereof, and the data line D composed of the second metal layer are formed on the second interlayer insulating film 93. In the impurity region DSI of the semiconductor layer SI interposed between the first compensation transistor T21 and the second compensation transistor T22, the semiconductor layer SI and the projection ELP of the high-level power source line ELVDD are separated by the gate insulating film 91 and the first and second interlayer insulating films 92, 93.

As illustrated in FIG. 14(c), the irradiation region LA within the impurity region DSI is irradiated from the rear face side of the insulating substrate 90 with laser light having an output configured to evaporate each insulating film provided between the impurity region DSI of the semiconductor layer SI and the projection ELP of the high-level power source line ELVDD, and melt and thus reliably connect the semiconductor layer SI and the projection ELP of the high-level power source line ELVDD. Thus, the impurity region DSI of the semiconductor layer SI and the projection ELP of the high-level power source line ELVDD are connected and the high-level potential ELVDD is applied from the high-level power source line ELVDD to the gate terminal of the drive transistor T4, and thus the drive transistor T4 is turned to an off state and the pixel circuit is converted into a black dot. Note that, in the third wiring line layout, the high-level power source line ELVDD connected to the projection ELP that applies the off voltage to the impurity region DSI may be referred to as the "off-voltage supply wiring line".

1.5.4 Fourth Wiring Line Layout

Figure 15:
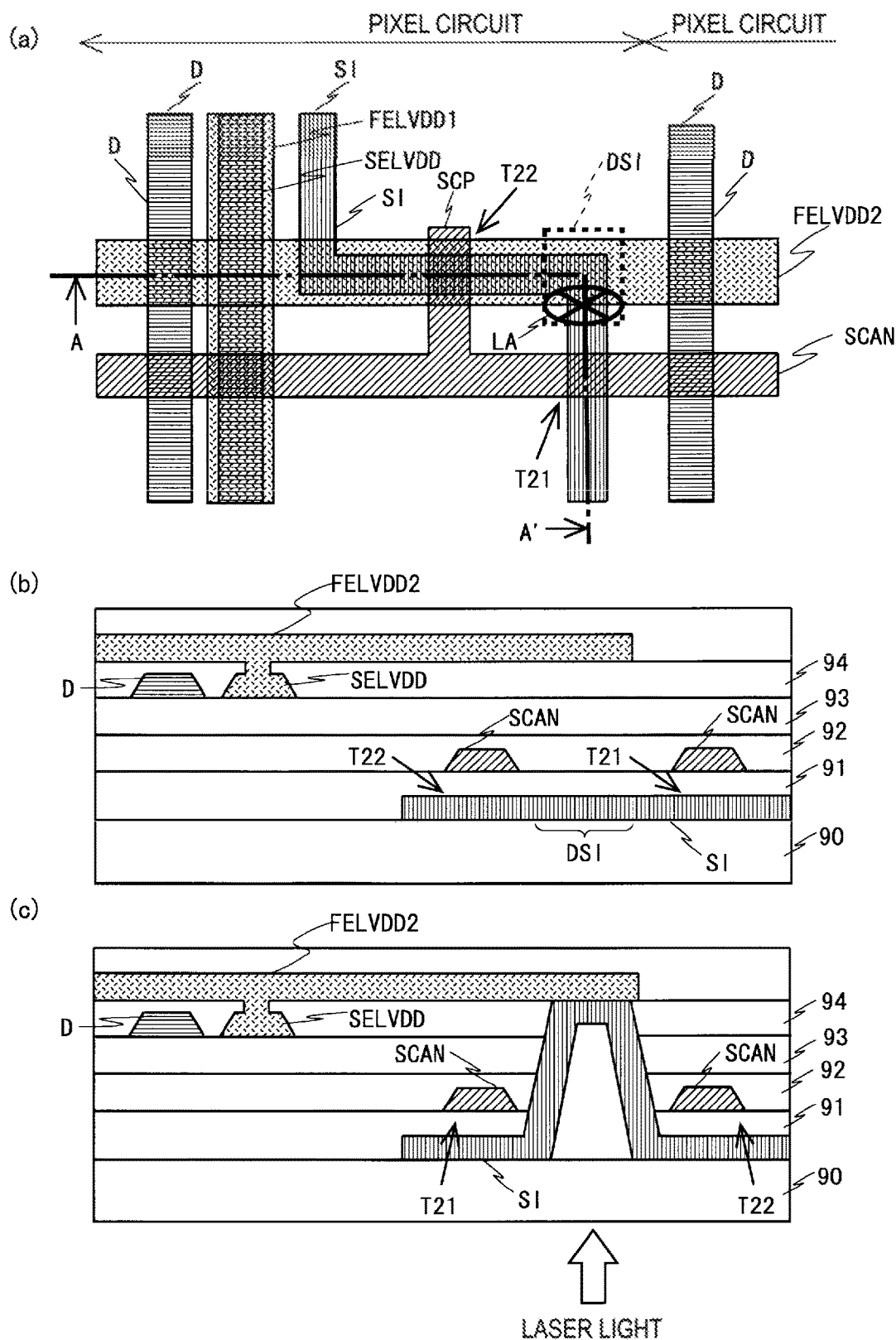
FIGS. 15(a) to 15(c) are drawings illustrating a fourth wiring line layout for making a repair, where

FIGS. 15(a) to 15(c) are drawings illustrating the fourth wiring line layout for making a repair, where FIG. 15(a) is a plan view of a portion of the wiring line layout, FIG. 15(b) is a cross-sectional view along the arrow A-A' of the wiring line layout before repair, and FIG. 15(c) is a cross-sectional view along the arrow A-A° of the wiring line layout after repair.

As illustrated in FIG. 15(a), a parallel first high-level power source line FELVDD1 is disposed parallel to the data line D of the pixel circuit, and the scanning line SCAN and an intersecting first high-level power source line FELVDD2 are disposed intersecting these. The parallel first high-level power source line FELVDD1 and the intersecting first high-level power source line FELVDD2 are formed by the same metal layer and are connected so as to have the same potential as described later. Further, a second high-level power source line SELVDD is formed superimposed onto the parallel first high-level power source line FELVDD1.

The scanning line SCAN includes the projection SCP that branches from the scanning line SCAN and extends parallel to the parallel first high-level power source line FELVDD1, in a region interposed between the parallel first high-level power source line FELVDD1 and the data line D of the pixel circuit adjacent thereto. Further, the first compensation transistor T21 is formed at a position where the scanning line SCAN intersects the semiconductor layer SI, and the second compensation transistor T22 is formed at a position where the projection SCP of the scanning line SCAN intersects the semiconductor layer SI. Note that the parallel first high-level power source line FELVDD1, the intersecting first high-level power source line FELVDD2, and the second high-level power source line SELVDD may be collectively referred to as the "first power source wiring line".

Next, the repair method will be described. As illustrated in FIG. 15(b), the gate insulating film 91 is formed covering the semiconductor layer SI formed on the insulating substrate 90. The scanning line SCAN is formed on the gate insulating film 91, and the gate insulating film 91 is formed covering the scanning line SCAN. The scanning line SCAN is formed on the gate insulating film 91. The first and second interlayer insulating films 92, 93 are formed covering the scanning line SCAN. The second high-level power source line SELVDD and the data line D composed of the second metal layer are formed on the second interlayer insulating film 93. A third interlayer insulating film 94 is formed covering the second high-level power source line SELVDD and the data line D. The parallel first high-level power source line FELVDD1 and the intersecting first high-level power source line FELVDD2 are formed on the third interlayer insulating film 94.

The intersecting first high-level power source line FELVDD2 and the second high-level power source line SELVDD are connected by a contact hole. Thus, the parallel first high-level power source line FELVDD1, the intersecting first high-level power source line FELVDD2, and the second high-level power source line SELVDD are connected to each other, and thus the potentials thereof become a power supply potential that is the high-level potential ELVDD. Note that, in FIG. 15(b), the parallel first high-level power source line FELVDD1 is overlapping the intersecting first high-level power source line FELVDD2, and is thus not illustrated. In this case, in the impurity region DSI of the semiconductor layer SI interposed between the first compensation transistor T21 and the second compensation transistor T22, the semiconductor layer SI and the intersecting first high-level power source line FELVDD2 are separated by the gate insulating film 91 and the first to third interlayer insulating films 92 to 94.

As illustrated in FIG. 15(c), the irradiation region LA within the impurity region DSI is irradiated from the rear face side of the insulating substrate 90 with laser light having an output configured to evaporate each insulating film provided between the impurity region DSI of the semiconductor layer SI and the intersecting first high-level power source line FELVDD2 and melt and thus reliably connect the semiconductor layer SI and the projection ELP of the high-level power source line ELVDD. As a result, the second high-level potential SELVDD is applied to the gate terminal of the drive transistor T4, and thus the drive transistor T4 is turned to an off state and the pixel circuit is converted into a black dot. Note that, in the fourth wiring line layout, the intersecting first high-level power source line FELVDD2 that applies an off voltage to the impurity region DSI may be referred to as the "off-voltage supply wiring line". More broadly, a first power source wiring line including the intersecting first high-level power source line FELVDD2 may be referred to as the "off-voltage supply wiring line". Further, the parallel first high-level power source line FELVDD1 may be referred to as a "parallel first power source wiring line", the intersecting first high-level power source line FELVDD2 may be referred to as an "intersecting first power source wiring line", and the second high-level power source line SELVDD may be referred to as a "lower layer first power source wiring line".

1.5.5 Fifth Wiring Line Layout

Figure 16:
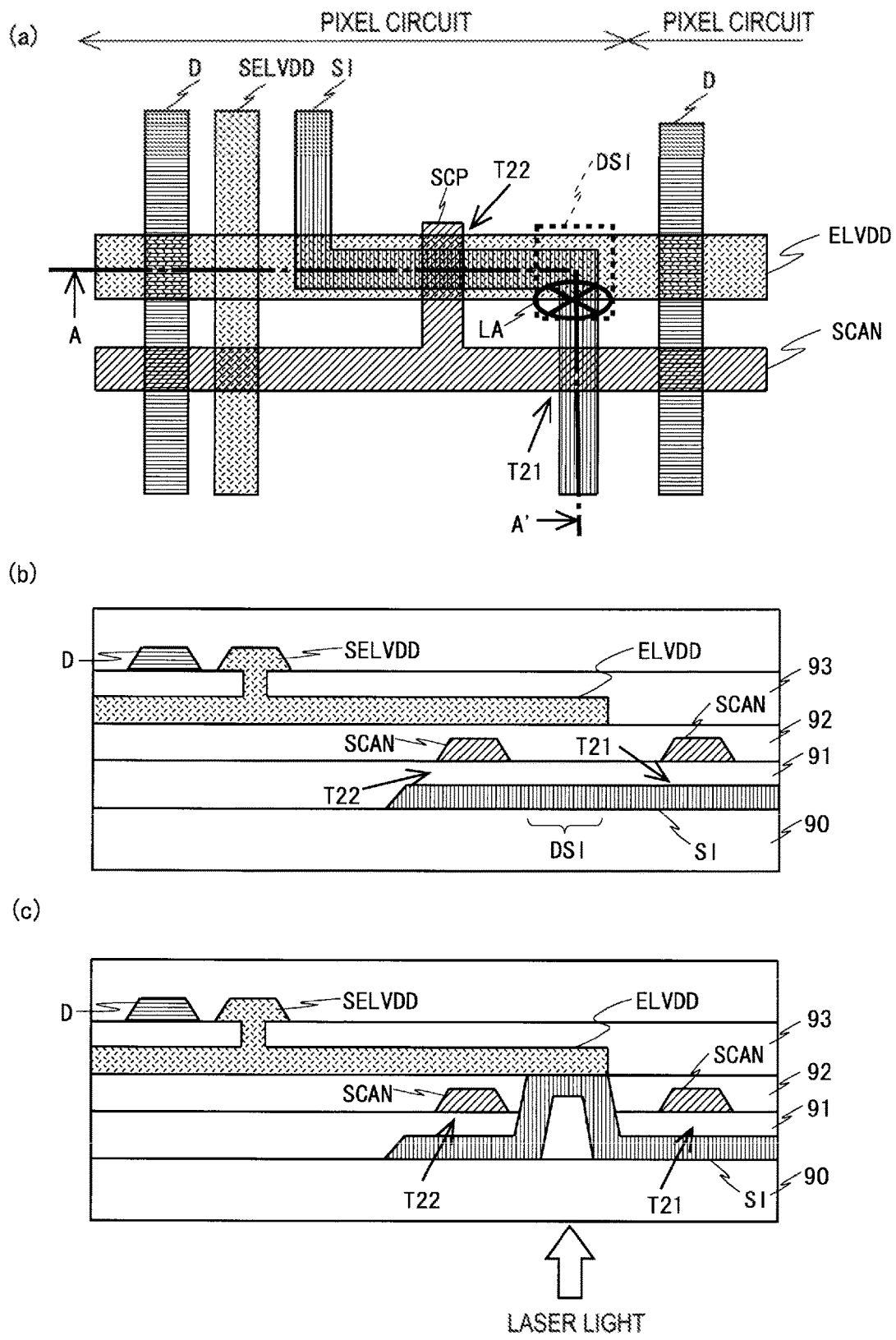
FIGS. 16(a) to 16(c) are drawing illustrating a fifth wiring line layout for making a repair, where

FIGS. 16(a) to 16(c) are drawings illustrating the fifth wiring line layout for making a repair, where FIG. 16(a) is a plan view of a portion of the wiring line layout, FIG. 16(b) is a cross-sectional view along the arrow A-A' of the wiring line layout before repair, and FIG. 16(c) is a cross-sectional view along the arrow A-A' of the wiring line layout after repair.

As illustrated in FIG. 16(a), only the second high-level power source line SELVDD is disposed parallel to the data line D of the pixel circuit, and the scanning line SCAN and the high-level power source line ELVDD are disposed intersecting these. The second high-level power source line SELVDD and the first high-level power source line ELVDD are formed by different metal layers, as described later. As described later, these lines are connected by a contact hole, and thus the potentials thereof become a power supply potential that is the high-level potential ELVDD. The scanning line SCAN includes the projection SCP that branches from the scanning line SCAN and extends parallel to the second high-level power source line SELVDD, in a region interposed between the second high-level power source line SELVDD and the data line D of the pixel circuit adjacent thereto.

The semiconductor layer SI is formed intersecting the projection SCP of the scanning line SCAN and the scanning line SCAN one time each. The first compensation transistor T21 is formed at a position where the scanning line SCAN formed on the gate insulating film 91 intersects the semiconductor layer SI, and the second compensation transistor T22 is formed at a position where the projection SCP of the scanning line SCAN intersects the semiconductor layer SI. The first interlayer insulating film 92 is formed covering the scanning line SCAN. The first high-level power source line ELVDD composed of the second metal layer is formed on the first interlayer insulating film 92. The second interlayer insulating film 93 is formed covering the first high-level power source line ELVDD. The second high-level power source line SELVDD and the data line D composed of the second metal layer are formed on the second interlayer insulating film 93. Note that the first high-level power source line ELVDD and the second high-level power source line SELVDD may be collectively referred to as the "first power source wiring line".

Next, the repair method will be described. As illustrated in FIG. 16(b), the impurity region DSI of the semiconductor layer SI interposed between the first compensation transistor T21 and the second compensation transistor T22 in which the gate terminal is formed by the scanning line SCAN, and the first high-level power source line ELVDD are separated by the gate insulating film 91 and the first interlayer insulating film 92. Further, the first high-level power source line ELVDD and the second high-level power source line SELVDD are connected to each other by a contact hole, and thus the potentials of both the first high-level power source line ELVDD and the second high-level power source line SELVDD become a power supply potential that is the high-level potential ELVDD.

As illustrated in FIG. 16(c), the irradiation region LA within the impurity region DSI is irradiated from the rear face side of the insulating substrate 90 with laser light having an output configured to evaporate the gate insulating film and the first interlayer insulating film provided between the impurity region DSI of the semiconductor layer SI and the first high-level power source line ELVDD, and melt and thus reliably connect the semiconductor layer SI and the first high-level power source line ELVDD. As a result, the second high-level potential SELVDD is applied to the gate terminal of the drive transistor T4, and thus the drive transistor T4 is turned to an off state and the pixel circuit is converted into a black dot. Note that, in the fifth wiring line layout, the first high-level power source line ELVDD that applies the off voltage to the impurity region DSI may be referred to as the "off-voltage supply wiring line". More broadly, the first power source wiring line including the first high-level power source line ELVDD may be referred to as the "off-voltage supply wiring line". Further, the second high-level power source line SELVDD may be referred to as an "upper layer first power source wiring line".

1.5.6 Sixth Wiring Line Layout

Figure 17:
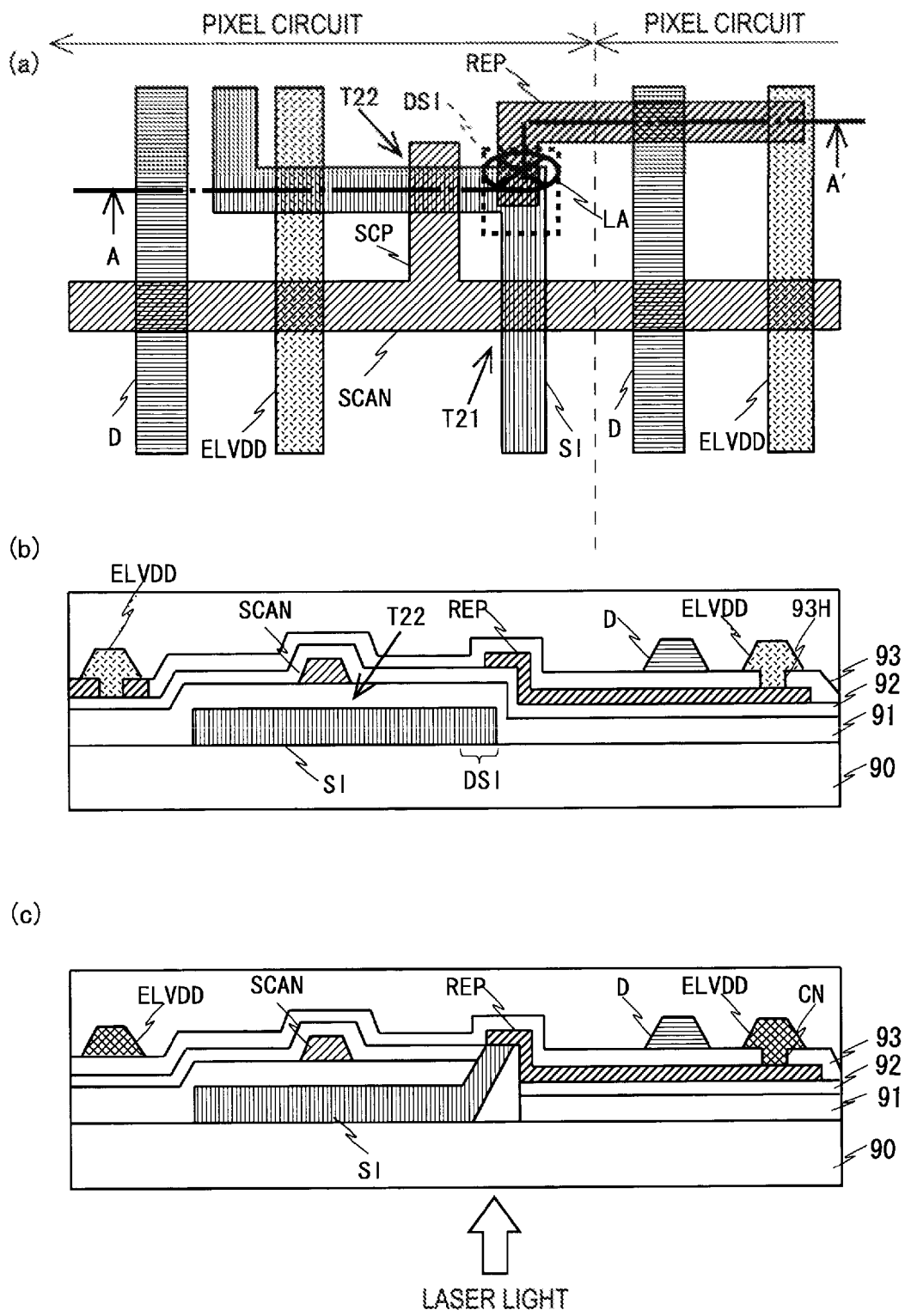
FIGS. 17(a) to 17(c) are drawings illustrating a sixth wiring line layout for making a repair, where

FIGS. 17(a) to 17(c) are drawings illustrating the sixth wiring line layout for making a repair, where FIG. 17(a) is a plan view of a portion of the wiring line layout, 17(b) is a cross-sectional view along the arrow A-A' of the wiring line layout before repair, and FIG. 17(c) is a cross-sectional view along the arrow A-A' of the wiring line layout after repair.

As illustrated in FIG. 17(a), the high-level power source line ELVDD and the data line D of the pixel circuit are disposed in parallel to the high-level power source line ELVDD and the data line D of a pixel circuit adjacent to the pixel circuit, and the scanning line SCAN is disposed intersecting these. The scanning line SCAN includes the projection SCP that branches from the scanning line SCAN and extends parallel to the high-level power source line ELVDD, in a region interposed between the high-level power source line ELVDD and the data line D of the pixel circuit adjacent thereto.

The semiconductor layer SI is formed intersecting the projection SCP of the scanning line SCAN and the scanning line SCAN one time each. The first compensation transistor T21 is formed at a position where the scanning line SCAN intersects the semiconductor layer SI, and the second compensation transistor T22 is formed at a position where the projection SCP of the scanning line SCAN intersects the semiconductor layer SI. Furthermore, one end of the repair wiring line REP used during repair is formed superimposed onto the impurity region DSI of the semiconductor layer SI. The other end of the repair wiring line REP, unlike the first wiring line layout, is connected, by the contact hole 93H, to the high-level power source line ELVDD of the adjacent pixel circuit instead of its own pixel circuit.

Next, the repair method will be described. As illustrated in FIG. 17(b), the impurity region DSI of the semiconductor layer SI interposed between the first compensation transistor T21 and the second compensation transistor T22, and one end of the repair wiring line REP are separated by the gate insulating film 91 and the first interlayer insulating film 92.

As illustrated in FIG. 17(c), the irradiation region LA within the impurity region DSI is irradiated from the rear face side of the insulating substrate 90 with laser light having an output configured to evaporate the gate insulating film 91 and the first interlayer insulating film 92 provided between the impurity region DSI of the semiconductor layer SI and the repair wiring line REP, and melt and thus reliably connect the semiconductor layer SI and the first high-level power source line ELVDD. As a result, the high-level potential ELVDD is applied to the gate electrode of the drive transistor T4, and thus the drive transistor T4 is turned to an off state and the pixel circuit is converted into a black dot. Note that, in the sixth wiring line layout, the high-level power source line ELVDD of the adjacent pixel circuit connected to the repair wiring line REP that applies the off voltage to the impurity region DSI may be referred to as the "off-voltage supply wiring line".

In the first through fifth of the first through sixth wiring line layouts, the impurity region of the semiconductor layer SI is connected to the high-level power source line provided in the same pixel circuit. However, in the sixth wiring line layout, the impurity region of the semiconductor layer SI is connected to the high-level power source line provided in an adjacent pixel circuit. In a case where the impurity region of the semiconductor layer SI is connected to the high-level power source line provided in the same pixel circuit, it is possible to repair a pixel circuit disposed at a border of the display region in which an adjacent pixel circuit is not present, and thus the frame can be narrowed.

1.6 Effects

According to the present embodiment, in the pixel circuit in which the second initialization transistor T7 is in a normally-on state, the drive transistor T4 can be set to a normally-off state by making a repair that applies the high-level potential ELVDD to the impurity region DSI of the semiconductor layer SI interposed between the first compensation transistor T21 and the second compensation transistor T22. This eliminates the problem of the high-level power source line ELVDD and the low-level power source line ELVSS being short-circuited as described with reference to FIG. 7. Furthermore, even in other pixel circuits that share the high-level power source line ELVDD with the pixel circuit including the second initialization transistor T7 in a normally-on state, the high-level potential ELVDD no longer fluctuates, making it possible to prevent the occurrence of a line defect.

Further, repair is made by irradiating the inorganic insulating film with the laser light to evaporate the inorganic insulating film, and melt and thus connect, or connect via the repair wiring line provided in the pixel circuit, the wiring line composed of the semiconductor layer and the high-level power source line ELVDD. Thus, the output of the laser light can be adjusted, making it possible to prevent the occurrence of a failure caused by a portion of the fused metal wiring line layer adhering to another location. Furthermore, in the case of the wiring line layouts illustrated in FIG. 12 to FIG. 14, repair can be made within the own pixel circuit without utilizing an adjacent pixel circuit as in the case illustrated in FIG. 15, meaning that the frame of the display panel can be narrowed.

2. Second Embodiment

A second embodiment will be described below. The configuration of the organic EL display device of the present embodiment, the configuration of the pixel circuit included in the display portion of the organic EL display device, and the operation of the pixel circuit are respectively the same as those in the first embodiment, and thus descriptions thereof will be omitted. Therefore, in the present embodiment, among the seven transistors constituting the pixel circuit, repair of the write transistor T3 in a normally-on state will be described.

2.1 Repair

Figure 18:
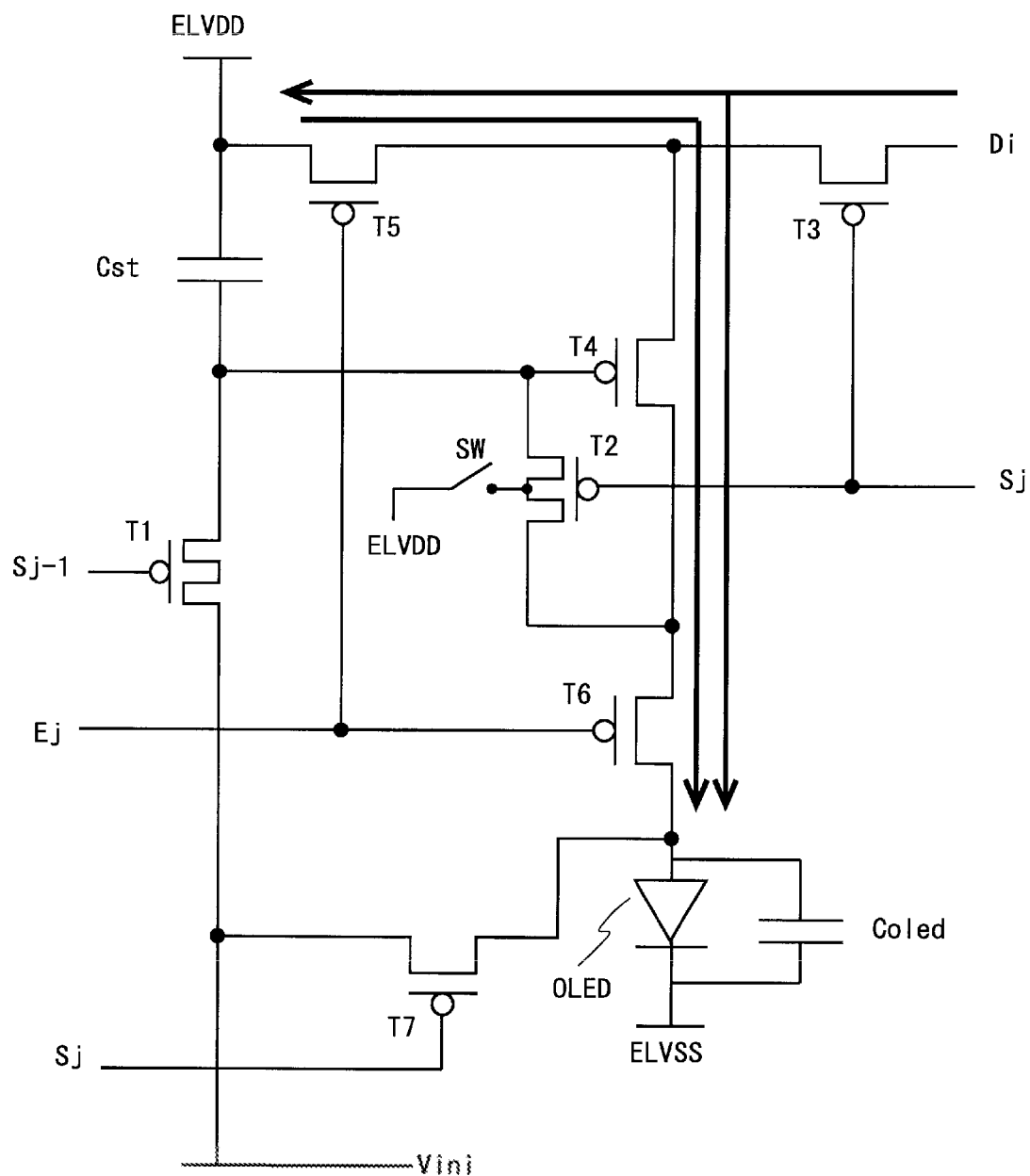
FIG. 18 is a drawing illustrating a problem when a write transistor included in a pixel circuit of an organic EL, display device according to a second embodiment is in a normally-on state.

First, a problem when the write transistor T3 is in a normally-on state will be described. FIG. 18 is a drawing illustrating a problem when the write transistor T3 is in a normally-on state. With reference to FIG. 3 and FIG. 18, the initialization period ends and, at the time t4 of the data writing period, the potential of the scanning line Sj changes from a high level to a low level, thereby turning the write transistor T3, the first compensation transistor T21, and the second compensation transistor T22 to an on state. This causes the data signal charged to the data line Di to be written to the node N via the write transistor T3, the drive transistor T4, the first compensation transistor T21, and the second compensation transistor T22, and be applied to the gate terminal of the drive transistor T4. Next, the potential of the scanning line Sj changes from a low level to a high level at the time t5, and the potential of the emission line Ei changes from a high level to a low level at the time t6 of the light emission period. As a result, the power supply transistor T5 and the light emission control transistor T6 turn to an on state. Thus, the current having a current value corresponding to the data signal flows from the high-level power source line ELVDD to the organic EL element OLED.

At this time, when the write transistor T3 is in a normally-on state due to malfunction, the high-level power source line ELVDD and the data line Di are short-circuited, and a portion of the current that should flow to the organic EL element OLED also flows to the high-level power source line ELVDD. As a result, the current flowing to the organic EL element OLED is reduced, and the organic EL element OLED emits light at a brightness different from the brightness corresponding to the data signal.

Further, the high-level potential ELVDD of the high-level power source line ELVDD also fluctuates due to the influence thereof, and thus an abnormal gray scale simultaneously occurs in other pixel circuits connected to the high-level power source line ELVDD. In this way, if an abnormal gray scale occurs simultaneously in a plurality of pixel circuits connected to the same high-level power source line ELVDD, the viewer visually recognizes the abnormality as a line defect.

Figure 19:
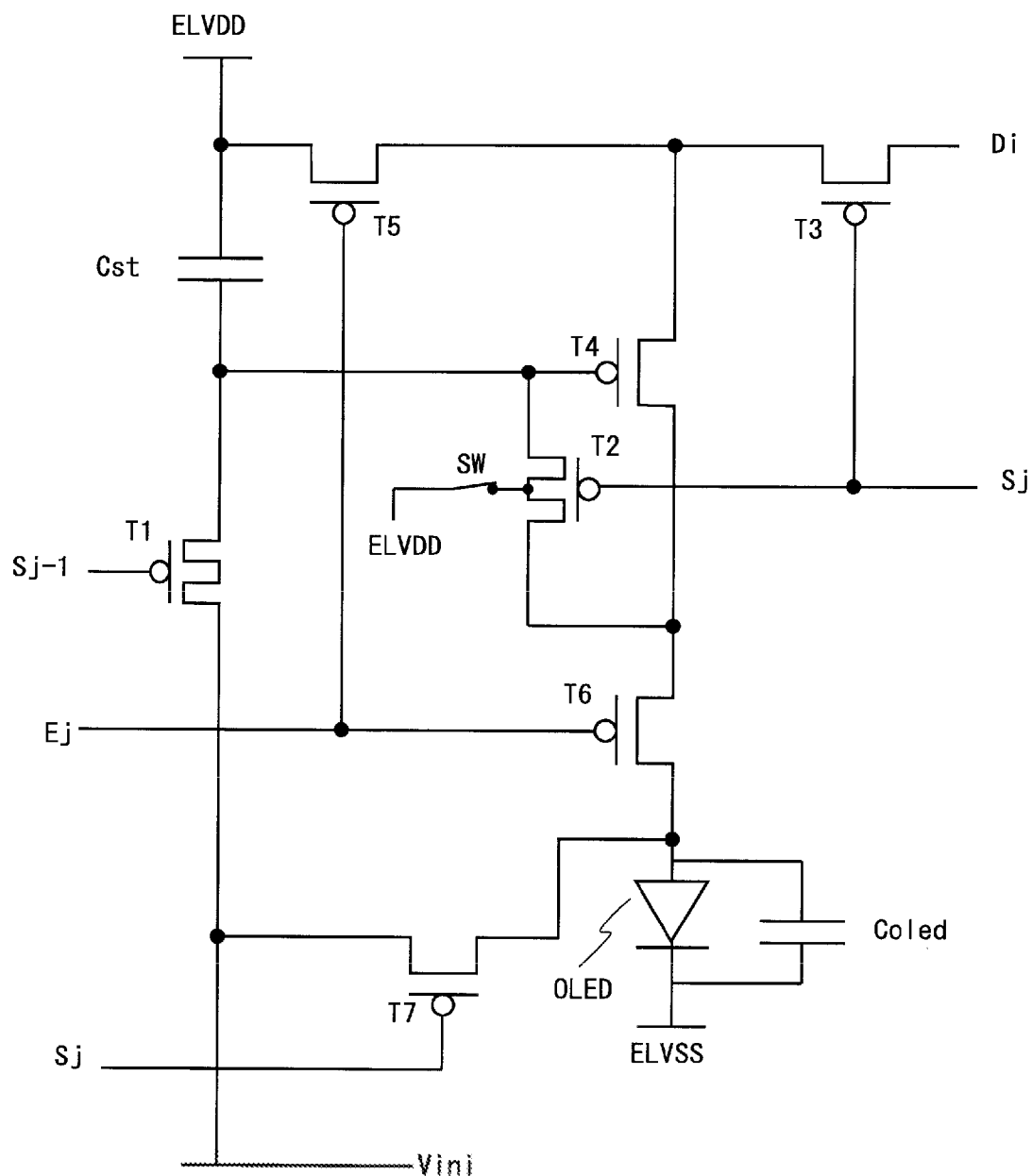
FIG. 19 is a drawing illustrating a first procedure of a repair made to improve malfunction of the write transistor illustrated in FIG. 18.
Figure 20:
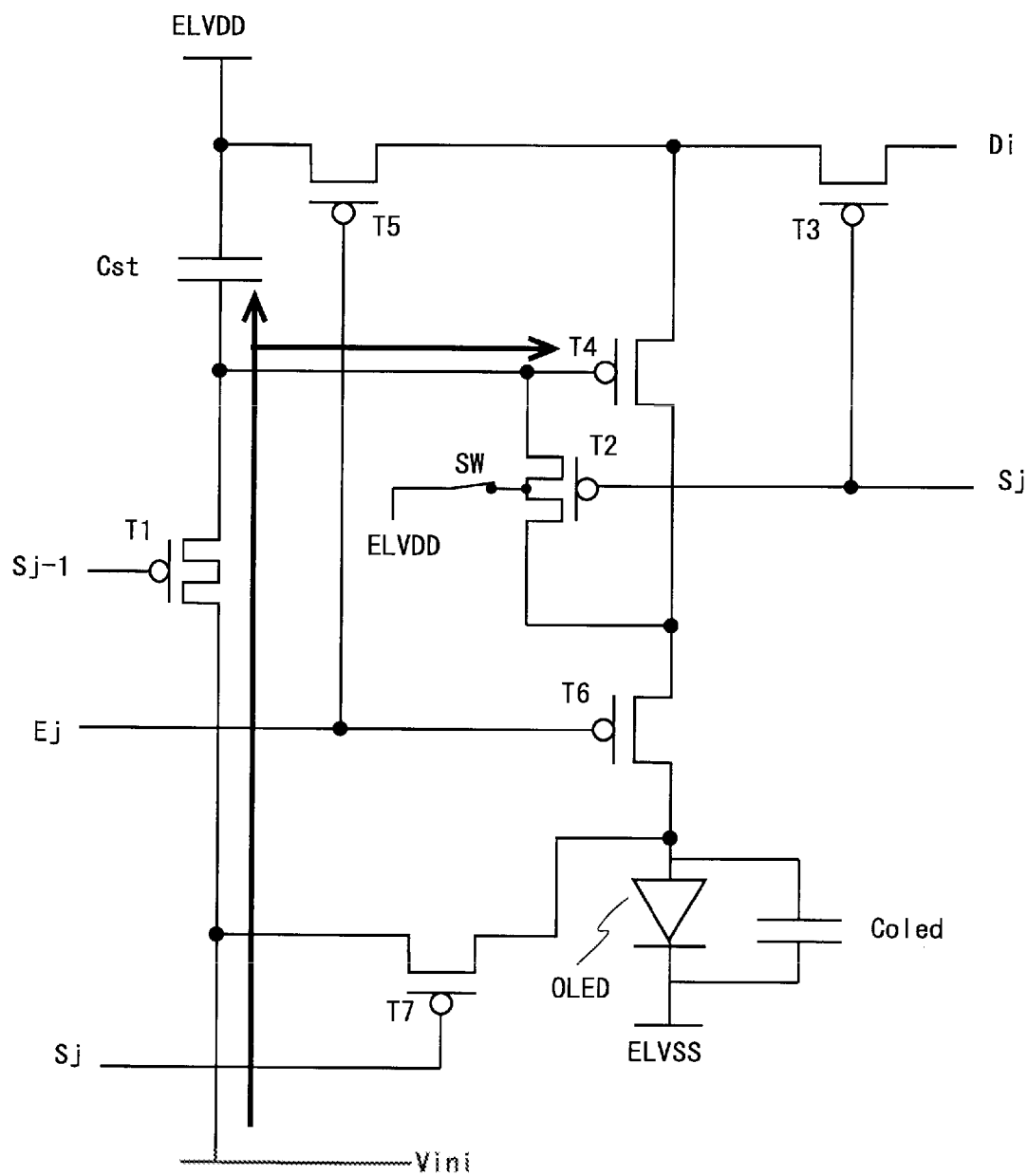
FIG. 20 is a drawing illustrating a procedure of the repair made in continuation of the procedure illustrated in FIG. 19 to improve malfunction of the write transistor illustrated in FIG. 18.

Therefore, the write transistor T3 in a normally-on state is repaired. FIG. 19 to FIG. 22 are drawings sequentially illustrating a repair procedure made to improve malfunction of the write transistor T3. First, as illustrated in FIG. 19, the connection point of the second conduction terminal of the first compensation transistor T21 and the first conduction terminal of the second compensation transistor T22 is irradiated with laser light, thereby evaporating the insulating film and connecting the connection point to an electrode having the high-level potential ELVDD. Thus, the high-level potential ELVDD is applied to the connection point interposed between the first compensation transistor T21 and the second compensation transistor T22. Then, at the time t2 illustrated in FIG. 3, when the potential of the preceding scanning line Sj−1 changes from a high level to a low level, the first initialization transistor T1 is turned to an on state. Thus, as illustrated in FIG. 20, the initialization potential Vini is applied to the storage capacitor Cst and the gate terminal of the drive transistor T4. As a result, the potentials of the storage capacitor Cst and the drive transistor T4 are initialized.

Figure 21:
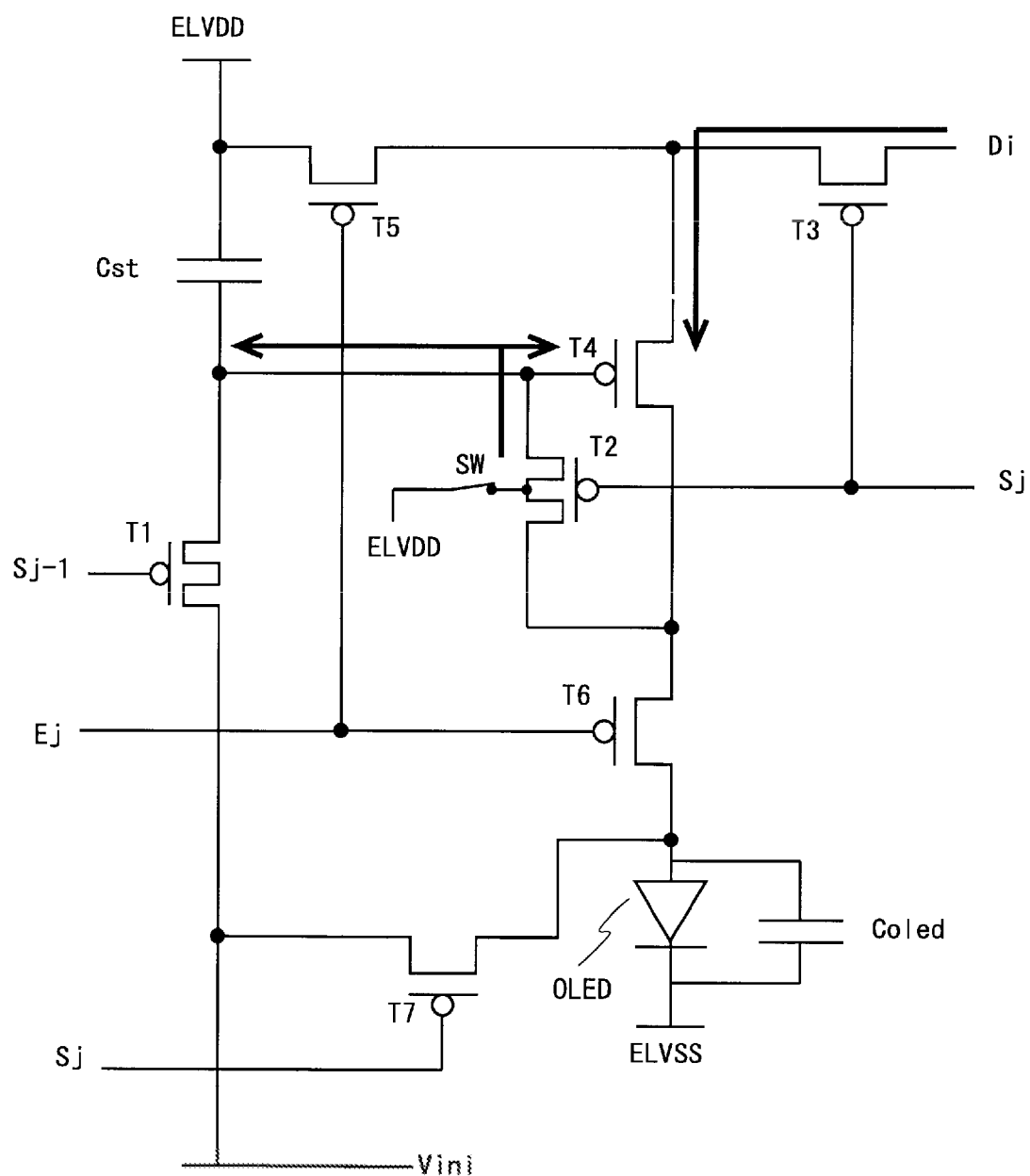
FIG. 21 is a drawing illustrating a procedure of the repair made in continuation of the procedure illustrated in FIG. 20 to improve malfunction of the write transistor illustrated in FIG. 18.

Next, at the time t4, when the potential of the scanning line Sj changes from a high level to a low level, the second compensation transistor T22 is turned to an on state, and the high-level potential ELVDD applied to the connection point of the first compensation transistor T21 and the second compensation transistor T22 is applied to the gate terminal of the drive transistor T4, as illustrated in FIG. 21. This turns the drive transistor T4 to an off state. Note that, while the write transistor T3 is in a normally-on state and thus a data signal is applied from the data line Di to the first conduction terminal of the drive transistor T4, the drive transistor T4 is in an off state and thus the data signal cannot pass through the drive transistor T4.

Figure 22:
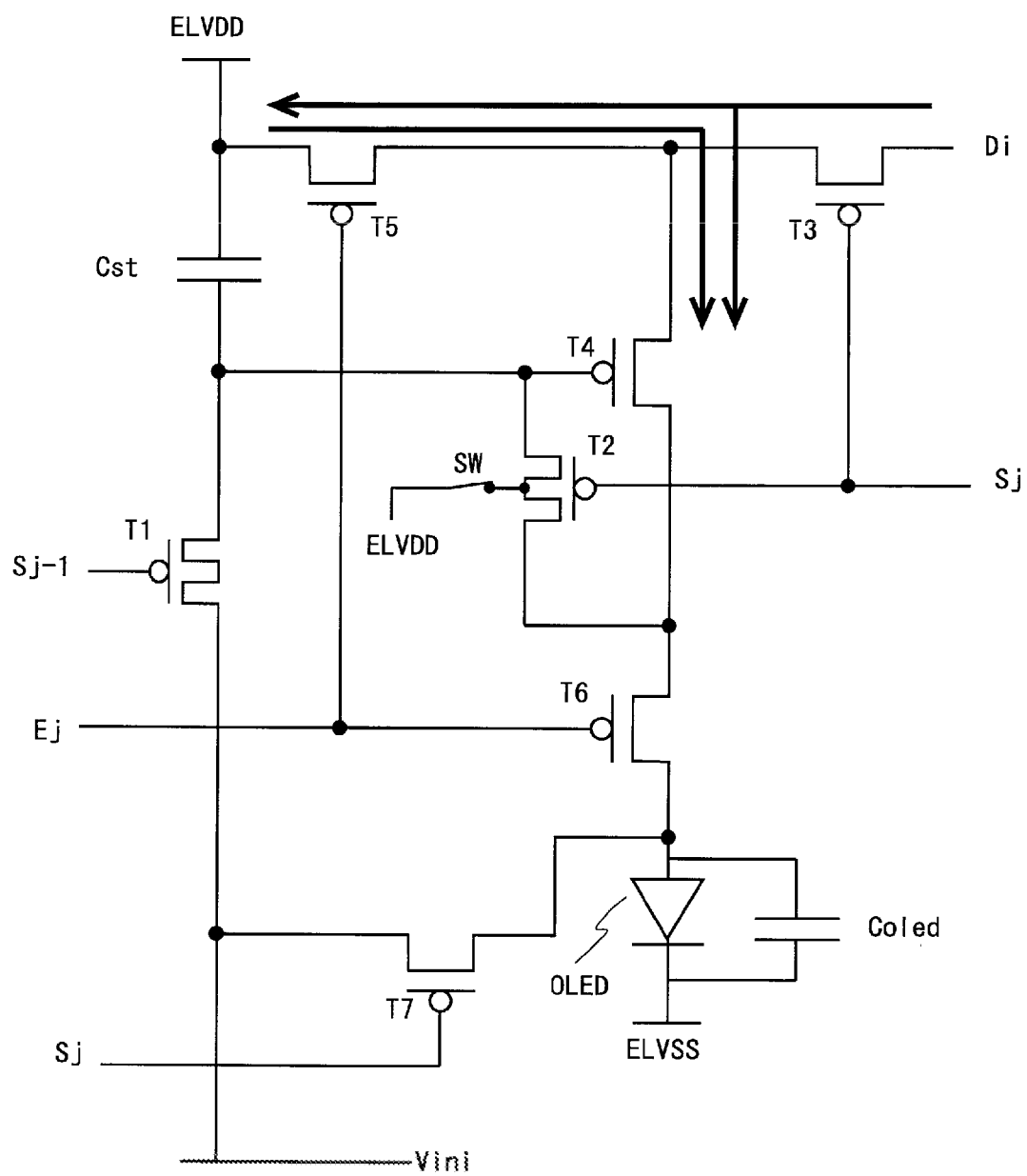
FIG. 22 is a drawing illustrating a procedure of the repair made in continuation of the procedure illustrated in FIG. 21 to improve malfunction of the write transistor illustrated in FIG. 18.

At the time t6, when the potential of the emission line Ej changes from a high level to a low level, the power supply transistor T5 and the light emission control transistor T6 are turned to an on state, as illustrated in FIG. 22. However, because the drive transistor T4 is in an off state at this time, current does not flow from the high-level power source line ELVDD to the organic EL element OLED. As a result, the organic EL element OLED is in a normally-off state, and thus the pixel circuit including the second initialization transistor in a normally-on state can be converted into a black dot.

At this time, even after repair, the write transistor T3 is in a normally-on state, and thus the data signal charged to the data line is applied to the second conduction terminal of the power supply transistor T5. Thus, at the time t6 when the emission line Ej changes from a high level to a low level, the power supply transistor T5 is turned to an on state, and the high-level potential ELVDD of the high-level power source line ELVDD fluctuates due to the influence of the data signal. Thus, an abnormal gray scale occurs in a plurality of other pixel circuits connected to the high-level power source line ELVDD, and the viewer visually recognizes such an abnormal gray scale as a line defect.

Figure 23:
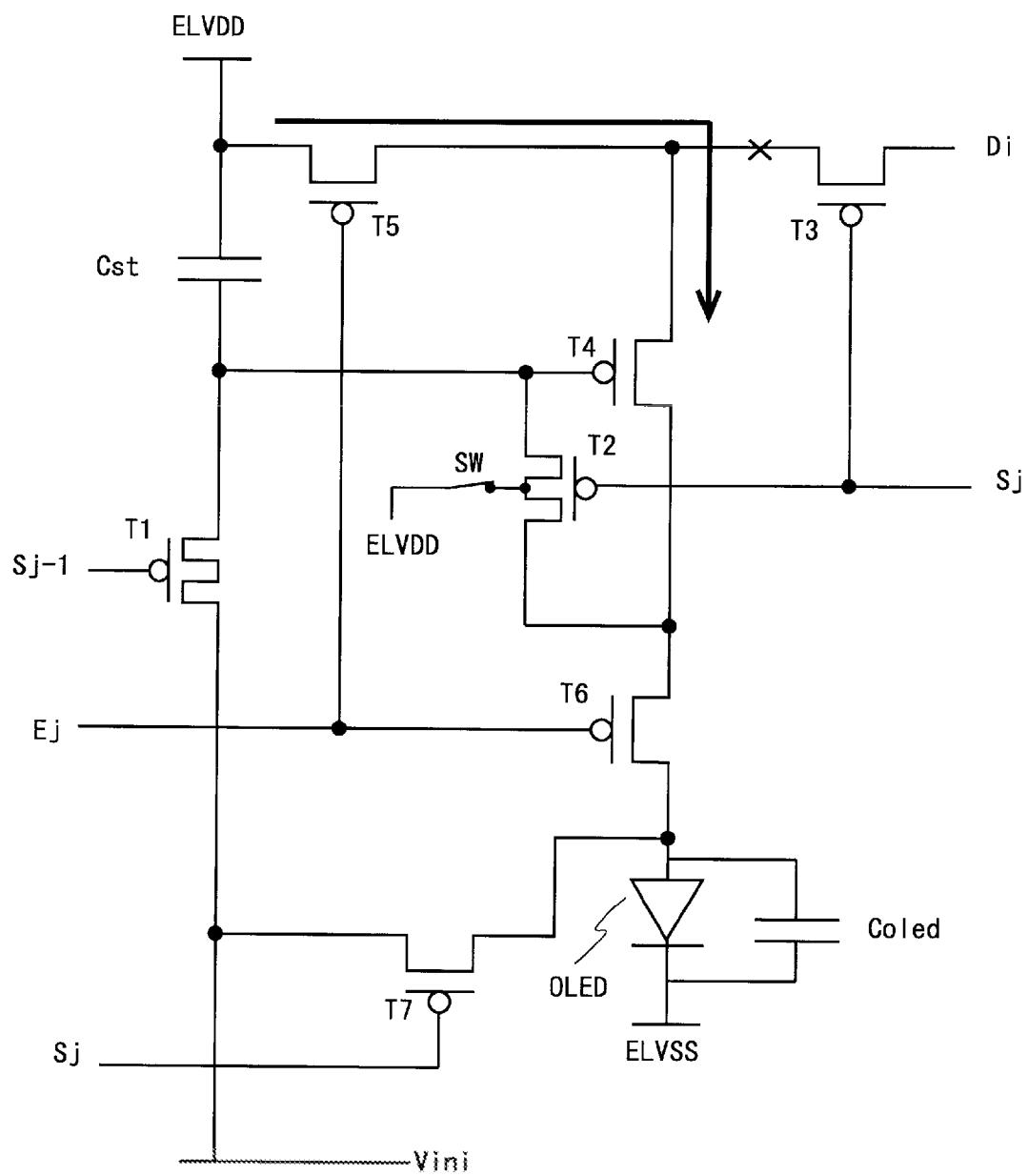
FIG. 23 is a drawing illustrating a repair made after the repair illustrated in FIG. 22, further ensuring that a line defect does not appear.

FIG. 23 is a drawing illustrating a pixel circuit that was further repaired after the repair illustrated in FIG. 22 to ensure that a line defect does not appear. A wiring line to be repaired by laser melting and connected to the second conduction terminal of the write transistor T3 is cut at a location marked by an "x", as illustrated in FIG. 23. Therefore, the data signal, which is always applied from the data line Di, is no longer applied, meaning that the high-level potential ELVDD of the high-level power source line ELVDD no longer fluctuates due to the data signal. As a result, the abnormal gray scale that occurs simultaneously in the pixel circuit including the write transistor T3 in a normally-on state and other pixel circuits sharing the high-level power source line ELVDD is eliminated, and the viewer no longer visually recognizes a line defect.

2.2 Effects

According to the present embodiment, in any pixel circuit, even in a case where the write transistor T3 is in a normally-on state, the drive transistor T4 can be turned to a normally-off state by making a repair that applies the high-level potential ELVDD to the impurity region DSI of the semiconductor layer SI interposed between the first compensation transistor T21 and the second compensation transistor T22. This makes it possible to convert the pixel circuit including the write transistor T3 in a normally-on state into a black dot.

Further, with only this repair, a line defect is visually recognized in other pixel circuits that share the high-level power source line ELVDD with the pixel circuit. Therefore, a portion of the wiring line connected to the write transistor T3 is further cut to suppress fluctuation in the high-level potential ELVDD. Thus, it is possible to make a line defect not appear.

While all seven of the transistors T1 to T7 are described as P-channel transistors in the above description, the transistors may be N-channel transistors. In this case, the impurity region of the semiconductor layer SI is an N-type impurity region, and the power supply voltage applied to the N-type impurity region is the low-level potential ELVSS. Further, the impurity region of the semiconductor layer SI including an oxide semiconductor such as indium gallium zinc oxide composed of indium (In), gallium (Ga), zinc (Zn), and oxygen (O) as main components refers to a conductor region of the oxide semiconductor film that is made electrically conductive by plasma treatment or the like.

REFERENCE SIGNS LIST

10 Display portion
11 Pixel circuit
93H Contact hole
T1 First initialization transistor
T2 Compensation transistor
T21 First compensation transistor
T22 Second compensation transistor
T3 Write transistor
T4 Drive transistor
T5 Power supply transistor
T6 Light emission control transistor
T7 Second initialization transistor
Cst Storage capacitor (holding capacitor)
OLED Organic EL element (electro-optical element)
SI Semiconductor layer
DSI Impurity region
REP Repair wiring line
D Data line
SCAN Scanning line
ELVDD High-level power source line, first high-level power source line (first power source wiring line)
FELVDD1 Parallel first high-level power source line (parallel first power source wiring line)
FELVDD2 Intersecting first high-level power source line (intersecting first power source wiring line)
SELVDD Second high-level power source line (lower layer first power source wiring line, upper layer first power source wiring line)

The invention claimed is:

1. A method for manufacturing a display device configured to display an image by supplying a data signal to each of a plurality of pixel circuits disposed in a display panel, the display device including:
a plurality of data lines supplied with the data signal;
a plurality of scanning lines sequentially supplied with a scanning signal used for selecting a pixel circuit of the plurality of pixel circuits;
the plurality of pixel circuits provided correspondingly to each intersection between the plurality of data lines and the plurality of scanning lines; and
a scanning line drive circuit configured to sequentially select each of the plurality of scanning lines,
wherein each of the plurality of pixel circuits includes:
an electro-optical element,
a holding capacitor configured to hold a voltage that controls a drive current of the electro-optical element,
a drive transistor configured to supply a drive current in accordance with the voltage held by the holding capacitor to the electro-optical element,
a compensation transistor configured to write the data signal applied from a data line of the plurality of data lines to a node connecting a control terminal of the drive transistor and the holding capacitor, and compensate a threshold voltage of the drive transistor,
a first power source wiring line configured to supply a power supply potential necessary for supplying a drive current to the electro-optical element and causing the electro-optical element to emit light, and
an off-potential supply wiring line configured to supply the power supply potential applied from the first power source wiring line as an off potential for turning the drive transistor to an off state,
the compensation transistor is a transistor having a dual control terminal structure composed of a first compensation transistor and a second compensation transistor and formed in a semiconductor layer connecting the node and a second conduction terminal of the drive transistor,
a second conduction terminal of the first compensation transistor and a first conduction terminal of the second compensation transistor are connected to an impurity region including impurities and formed in the semiconductor layer, interposed between the first compensation transistor and the second compensation transistor,
a first conduction terminal of the first compensation transistor is further connected to a second conduction terminal of the drive transistor,
a second conduction terminal of the second compensation transistor is connected to the node,
the first compensation transistor and a control terminal of the first compensation transistor are both connected to a scanning line of the plurality of scanning lines, and
a portion of the off-potential supply wiring line is formed superimposed onto the impurity region of the semiconductor layer with an inorganic insulating film interposed therebetween, and another portion of the off-potential supply wiring line is connected to a power source wiring line configured to apply the off potential,
the method comprising a step of:
irradiating a region where the off-potential supply wiring line and the impurity region are formed superimposed with laser light from a rear face side of the display panel, thereby electrically connecting the off-potential supply wiring line and the impurity region.

2. The method for manufacturing a display device according to claim 1,
wherein each of the plurality of pixel circuits includes:
an insulating substrate,
the semiconductor layer formed on the insulating substrate,
a gate insulating film formed covering the semiconductor layer,
a scanning line of the plurality of scanning lines that is superimposed onto the semiconductor layer at two locations, and thus serves as a control terminal of the first compensation transistor and a control terminal of the second compensation transistor at each of the two locations,
a first interlayer insulating film composed of the inorganic insulating film and formed covering the scanning line of the plurality of scanning lines,
a repair wiring line composed of a first metal layer and formed on the first interlayer insulating film, a second interlayer insulating film composed of the inorganic insulating film and formed covering the first metal layer, a data line of the plurality of data lines composed of a second metal layer and formed on the second interlayer insulating film, and the first power source wiring line formed parallel to the data line of the plurality of data lines and configured to apply the power supply potential, a portion of the repair wiring line is superimposed onto the impurity region of the semiconductor layer with the gate insulating film and the first interlayer insulating film interposed therebetween, and another portion of the repair wiring line is connected to the first power source wiring line via a contact hole formed in the second interlayer insulating film, thereby causing the power supply potential to be applied to the repair wiring line, and in the step of directly connecting the off-potential supply wiring line and the impurity region, the repair wiring line is the off-potential supply wiring line configured to apply the power supply potential as the off potential, and the gate insulating film and the first interlayer insulating film are the inorganic insulating film.

3. The method for manufacturing a display device according to claim 2, wherein the display device further includes the data line of the plurality of data lines composed of the second metal layer and formed on the second interlayer insulating film, and the data line of the plurality of data lines is formed without being superimposed onto the repair wiring line.

4. The method for manufacturing a display device according to claim 1, wherein each of the plurality of pixel circuits includes:

an insulating substrate, the semiconductor layer formed on the insulating substrate, a gate insulating film formed covering the semiconductor layer, a scanning line of the plurality of scanning lines that is superimposed onto the semiconductor layer at two locations, and thus serves as a control terminal of the first compensation transistor and a control terminal of the second compensation transistor at each of the two locations, a first interlayer insulating film and a second interlayer insulating film composed of the inorganic insulating film and formed covering the scanning line of the plurality of scanning lines, a data line of the plurality of data lines composed of a second metal layer and formed on the second interlayer insulating film, and the first power source wiring line formed parallel to the data line of the plurality of data lines and configured to apply the power supply potential, the first power source wiring line is formed interposed between the first interlayer insulating film and the second interlayer insulating film, superimposed onto the gate insulating film and the impurity region of the semiconductor layer, and in the step of directly connecting the off-potential supply wiring line and the impurity region, the first power source wiring line is the off-potential supply wiring line configured to apply the power supply potential as the off potential, and the gate insulating film, the first interlayer insulating film, and the second interlayer insulating film are the inorganic insulating film.

5. The method for manufacturing a display device according to claim 1, wherein each of the plurality of pixel circuits includes:

an insulating substrate, the semiconductor layer formed on the insulating substrate, a gate insulating film formed covering the semiconductor layer, a scanning line of the plurality of scanning lines that is superimposed onto the semiconductor layer at two locations, and thus serves as a control terminal of the first compensation transistor and a control terminal of the second compensation transistor for each of the two locations, a first interlayer insulating film and a second interlayer insulating film composed of the inorganic insulating film and formed covering the scanning line of the plurality of scanning lines, a data line of the plurality of data lines composed of a second metal layer and formed on the second interlayer insulating film, and the first power source wiring line formed parallel to the data line of the plurality of data lines and configured to apply the power supply potential, the first power source wiring line includes a projection that branches from the first power source wiring line and extends parallel to the scanning line of the plurality of scanning lines, a portion of the projection is superimposed onto a region of the semiconductor layer interposed between the first compensation transistor and the second compensation transistor, and in the step of directly connecting the off-potential supply wiring line and the impurity region, the first power source wiring line including the branched projection is the off-potential supply wiring line configured to apply the power supply potential as the off potential, and the gate insulating film, the first interlayer insulating film, and the second interlayer insulating film are the inorganic insulating film.

6. The method for manufacturing a display device according to claim 1, wherein each of the plurality of pixel circuits includes:

an insulating substrate, the semiconductor layer formed on the insulating substrate, a gate insulating film formed covering the semiconductor layer, a scanning line of the plurality of scanning lines that is superimposed onto the semiconductor layer at two locations, and thus serves as a control terminal of the first compensation transistor and a control terminal of the second compensation transistor at each of the two locations, a first interlayer insulating film and a second interlayer insulating film composed of the inorganic insulating film and formed covering the scanning line of the plurality of scanning lines, a data line of the plurality of data lines composed of a second metal layer and formed on the second interlayer insulating film, a lower layer first power source wiring line formed parallel to the data line of the plurality of data lines, a third interlayer insulating film composed of the inorganic insulating film and formed covering the data line of the plurality of data lines and the lower layer first power source wiring line, and a parallel first power source wiring line formed parallel to the data line of the plurality of data lines and an intersecting first power source wiring line formed intersecting the data line of the plurality of data lines, the parallel first power source wiring line and the intersecting first power source wiring line being composed of a third metal layer and formed on the third interlayer insulating film, the lower layer first power source wiring line, the parallel first power source wiring line, and the intersecting first power source wiring line are connected to each other, thereby causing the power supply potential to be applied thereto, and in the step of directly connecting the off-potential supply wiring line and the impurity region, the intersecting first power source wiring line is the off-potential supply wiring line configured to apply the power supply potential as the off potential, and the gate insulating film, the first interlayer insulating film, the second interlayer insulating film, and the third interlayer insulating film are the inorganic insulating film.

7. The method for manufacturing a display device according to claim 1,
wherein each of the plurality of pixel circuits includes:
an insulating substrate,
the semiconductor layer formed on the insulating substrate,
a gate insulating film formed covering the semiconductor layer,
a scanning line of the plurality of scanning lines that is superimposed onto the semiconductor layer at two locations, and thus serves as a control terminal of the first compensation transistor and a control terminal of the second compensation transistor at each of the two locations,
a first interlayer insulating film composed of the inorganic insulating film and formed covering the scanning line of the plurality of scanning lines,
the first power source wiring line composed of a first metal layer and formed on the first interlayer insulating film, and configured to apply the power supply potential,
a second interlayer insulating film composed of the inorganic insulating film and formed covering the first power source wiring line,
a data line of the plurality of data lines composed of a second metal layer and formed on the second interlayer insulating film, and
an upper layer first power source wiring line formed parallel to the data line of the plurality of data lines,
the first power source wiring line and the upper layer power source wiring line are connected, and
in the step of directly connecting the off-potential supply wiring line and the impurity region, the first power source wiring line is the off-potential supply wiring line configured to apply the power supply potential as the off potential, and the gate insulating film and the first interlayer insulating film are the inorganic insulating film.

8. The method for manufacturing a display device according to claim 1,
wherein each of the plurality of pixel circuits includes:
an insulating substrate,
the semiconductor layer formed on the insulating substrate,
a gate insulating film formed covering the semiconductor layer,
a scanning line of the plurality of scanning lines that is superimposed onto the semiconductor layer at two locations, and thus serves as a control terminal of the first compensation transistor and a control terminal of the second compensation transistor at each of the two locations,
a first interlayer insulating film composed of the inorganic insulating film and formed covering the scanning line of the plurality of scanning lines,
a repair wiring line composed of a first metal layer and formed on the first interlayer insulating film,
a second interlayer insulating film composed of the inorganic insulating film and formed covering the first metal layer, and
the first power source wiring line composed of a second metal layer and formed on the second interlayer insulating film,
a portion of the repair wiring line formed on the pixel circuit of the plurality of pixel circuits is formed superimposed onto the impurity region of the semiconductor layer with the gate insulating film and the first interlayer insulating film interposed therebetween, and another portion of the repair wiring line is connected to the first power source wiring line via a contact hole formed in the second interlayer insulating film in another pixel circuit of the plurality of pixel circuits that is adjacent to the pixel circuit of the plurality of pixel circuits, thereby applying the power supply potential to the repair wiring line, and
in the step of directly connecting the off-potential supply wiring line and the impurity region, the repair wiring line is the off-potential supply wiring line configured to apply the power supply potential as the off potential, and the gate insulating film and the first interlayer insulating film are the inorganic insulating film.

9. The method for manufacturing a display device according to claim 1, further comprising a step of:
cutting a wiring line connected to at least one of a first conduction terminal and a second conduction terminal of a write transistor when the write transistor turns to normally-on state due to malfunction, the write transistor being further included in each of the plurality of pixel circuits and configured to write the data signal from the data line of the plurality of data lines to the pixel circuit of the plurality of pixel circuits.

10. A display device configured to display an image by supplying a data signal to each of a plurality of pixel circuits disposed in a display panel, the display device comprising:
a plurality of data lines supplied with the data signal;
a plurality of scanning lines sequentially supplied with a scanning signal used for selecting a pixel circuit of the plurality of pixel circuits;
the plurality of pixel circuits provided correspondingly to each intersection between the plurality of data lines and the plurality of scanning lines; and
a scanning line drive circuit configured to sequentially select each of the plurality of scanning lines,
wherein each of the plurality of pixel circuits includes:
an electro-optical element,
a holding capacitor configured to hold a voltage that controls a drive current of the electro-optical element,
a drive transistor configured to supply a drive current in accordance with the voltage held by the holding capacitor to the electro-optical element, a compensation transistor configured to write the data signal applied from a data line of the plurality of data lines to a node connecting a control terminal of the drive transistor and the holding capacitor, and compensate a threshold voltage of the drive transistor, a first power source wiring line configured to supply a power supply potential necessary for supplying a drive current to the electro-optical element and causing the electro-optical element to emit light, and an off-potential supply wiring line configured to supply the power supply potential applied from the first power source wiring line, the compensation transistor is a transistor having a dual control terminal structure composed of a first compensation transistor and a second compensation transistor and formed in a semiconductor layer connecting the node and a second conduction terminal of the drive transistor, a second conduction terminal of the first compensation transistor and a first conduction terminal of the second compensation transistor are connected to an impurity region including impurities and formed in the semiconductor layer, interposed between the first compensation transistor and the second compensation transistor, a first conduction terminal of the first compensation transistor is further connected to a second conduction terminal of the drive transistor, a second conduction terminal of the second compensation transistor is connected to the node, the first compensation transistor and a control terminal of the first compensation transistor are both connected to a scanning line of the plurality of scanning lines, each of the plurality of pixel circuits includes a first pixel circuit configured to display a bright dot and a second pixel circuit configured to display a black dot, in the first pixel circuit, a portion of the off-potential supply wiring line is formed superimposed onto the impurity region of the semiconductor layer with an inorganic insulating film interposed therebetween, and the electro-optical element of the first pixel circuit is lit in accordance with a data signal input to a control terminal of the drive transistor, and in the second pixel circuit, a portion of the off-potential supply wiring line is connected to the first power source wiring line configured to apply the off potential, and the off-potential supply wiring line and the impurity region are electrically connected in another portion of the off-potential supply wiring line, thereby turning off the electro-optical element.

11. The display device according to claim 10, wherein, in the first pixel circuit, another portion of the off-potential supply wiring line is superimposed onto the first power source wiring line with the first power source wiring line and the inorganic insulating film interposed therebetween.

12. The display device according to claim 10, wherein the off-potential supply wiring line is the first power source wiring line.

13. The display device according to claim 10, wherein the off-potential supply wiring line is a wiring line branched from the first power source wiring line.

14. The display device according to claim 10, wherein, in the second pixel circuit, when an active scanning signal is applied to the scanning line of the plurality of scanning lines, the first compensation transistor and the second compensation transistor are each turned to an on state, thereby causing the power supply potential to be input to a control terminal of the drive transistor, the power supply potential to be held in the holding capacitor, and the drive transistor to be turned to an off state during a period in which the electro-optical element is caused to emit light.

15. The display device according to claim 10, wherein the compensation transistor is a P-channel transistor, and the power supply potential is a high-level potential.

* * * * *